(12) United States Patent
Nishiyama et al.

(10) Patent No.: US 9,601,455 B2
(45) Date of Patent: Mar. 21, 2017

(54) SEMICONDUCTOR DEVICE AND METHOD FOR MAKING SEMICONDUCTOR DEVICE

(71) Applicant: ROHM CO., LTD., Kyoto-shi, Kyoto (JP)

(72) Inventors: Yuto Nishiyama, Kyoto (JP); Motoharu Haga, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 14/755,334

(22) Filed: Jun. 30, 2015

(65) Prior Publication Data

US 2016/0005708 A1    Jan. 7, 2016

(30) Foreign Application Priority Data

Jul. 4, 2014  (JP) ................................ 2014-138899
Jul. 4, 2014  (JP) ................................ 2014-138900
Jun. 29, 2015  (JP) ................................ 2015-129698

(51) Int. Cl.
*G01R 33/02*  (2006.01)
*H01L 23/00*  (2006.01)
(Continued)

(52) U.S. Cl.
CPC .......... *H01L 24/48* (2013.01); *G01R 33/0005* (2013.01); *G01R 33/0047* (2013.01); *G01R 33/02* (2013.01); *H01L 21/78* (2013.01); *H01L 23/3121* (2013.01); *H01L 24/32* (2013.01); *H01L 24/73* (2013.01); *H01L 24/83* (2013.01); *H01L 24/85* (2013.01); *H01L 24/92* (2013.01); *H01L 24/97* (2013.01); *H01L 21/561* (2013.01); *H01L 24/45* (2013.01); *H01L 2224/32145* (2013.01); *H01L 2224/32225* (2013.01); *H01L 2224/45144* (2013.01); *H01L 2224/48091* (2013.01); *H01L 2224/48145* (2013.01);
(Continued)

(58) Field of Classification Search
CPC .... G01R 33/02; G01R 33/20; G01R 324/302; G01R 33/24; G01R 33/243; G01R 33/246; G01R 324/323
See application file for complete search history.

(56) References Cited

U.S. PATENT DOCUMENTS 7,298,140 B2 * 11/2007 Honkura ............ G01R 33/0206
                                                    324/247
7,559,148 B2 *  7/2009 Hayama ............. G01R 33/0206
                                                    33/355 R
(Continued)

FOREIGN PATENT DOCUMENTS

JP        2009-300093 A    12/2009

*Primary Examiner* — Benjamin Sandvik
(74) *Attorney, Agent, or Firm* — Hamre, Schumann, Mueller & Larson, P.C.

(57) ABSTRACT

A semiconductor device includes: a substrate including a base member having a main surface and a back surface facing opposite in a thickness direction; a semiconductor element mounted on the main surface of the substrate and having at least one element pad; a wire having a bonding portion bonded to the element pad; and a sealing resin formed on the main surface of the substrate for covering the wire and at least a portion of the semiconductor element. The semiconductor element has an element exposed side surface that faces in a direction crossing the thickness direction of the substrate and is exposed from the sealing resin.

19 Claims, 33 Drawing Sheets

(51) Int. Cl.
  *H01L 21/78* (2006.01)
  *G01R 33/00* (2006.01)
  *H01L 23/31* (2006.01)
  *H01L 21/56* (2006.01)

(52) U.S. Cl.
  CPC ............ *H01L 2224/48227* (2013.01); *H01L 2224/48471* (2013.01); *H01L 2224/73265* (2013.01); *H01L 2224/92247* (2013.01); *H01L 2224/97* (2013.01); *H01L 2924/11* (2013.01); *H01L 2924/181* (2013.01)

(56) References Cited

U.S. PATENT DOCUMENTS

| | | | | |
|---|---|---|---|---|
| 8,387,854 B2 * | 3/2013 | Hawat | ............... | B23K 1/0008 228/170 |
| 8,455,962 B2 | 6/2013 | Honkura et al. | | |
| 2005/0242805 A1 * | 11/2005 | Honkura | ............ | G01R 33/0206 324/249 |
| 2006/0180910 A1 * | 8/2006 | Miyazawa | ............... | H01L 23/13 257/685 |
| 2009/0293294 A1 * | 12/2009 | Kitaura | ............. | G01R 33/0206 33/355 R |
| 2011/0089512 A1 * | 4/2011 | Honkura | ............. | G01R 33/063 257/427 |
| 2012/0313193 A1 * | 12/2012 | Rieger | ............... | G01R 33/0052 257/427 |
| 2013/0127454 A1 * | 5/2013 | Ungaretti | ............ | G01R 33/096 324/251 |
| 2013/0285263 A1 * | 10/2013 | Arnold | ................... | G06F 1/16 257/780 |

* cited by examiner

SEMICONDUCTOR DEVICE AND METHOD FOR MAKING SEMICONDUCTOR DEVICE

BACKGROUND OF THE INVENTION

1. Field of the Invention

The present invention relates to semiconductor devices and methods for making a semiconductor device.

2. Description of Related Art

A semiconductor device has been proposed that includes a plurality of direction sensor elements utilizing geomagnetism and detects an orientation with respect to three axes in three-dimensional space. JP-A-2009-300093 discloses a semiconductor device including a substrate, and three direction sensor elements and an integrated circuit element that are mounted on the substrate. The three direction sensor elements each have a magnetic material wire that forms a corresponding detection reference axis. The three direction sensor elements are mounted on the substrate with the respective magnetic material wires being oriented in different directions, e.g., directions perpendicular to each other. Also, the integrated circuit element outputs the orientation of the semiconductor device with respect to the three axes as an electrical signal based on the outputs of the three direction sensor elements.

However, in general, the detection reference axis of one of the three direction sensor elements coincides with the thickness direction of the substrate. The direction sensor element having such a detection reference axis is mounted on the substrate in an upright position. Such a direction sensor element is more difficult to electrically connect to the substrate than is a direction sensor element that is parallel to the substrate. Therefore, there is a demand for more reliable and more stable electrical connection.

There is also a strong demand for the size reduction of such a semiconductor device. To meet this demand, it is also necessary to reduce the size of the direction sensor element and, in addition, the size of an arrangement forming the detection reference axis. The arrangement forming the detection reference axis includes, for example, a magnetic material wire and a coil wound around the wire. The magnetic material wire and coil need to detect a change in the orientation with respect to geomagnetism as a small electrical change, and therefore, are precisely finished. Therefore, the above arrangement desirably has a reduced size and a sufficiently high direction detection precision with respect to geomagnetism.

SUMMARY OF THE INVENTION

With the above circumstances in mind, the present invention has been made. It is a main object of the present invention to provide a semiconductor device that can electrically connect a semiconductor element more reliably and stably, and a method for making such a semiconductor device.

A semiconductor device provided according to a first aspect of the present invention includes: a substrate including a base member having a main surface and a back surface facing opposite in a thickness direction; a semiconductor element mounted on the main surface of the substrate and having at least one element pad; a wire having a bonding portion bonded to the element pad; and a sealing resin formed on the main surface of the substrate, and covering the wire and at least a portion of the semiconductor element. The semiconductor element has an element exposed side surface that faces in a direction crossing the thickness direction of the substrate and is exposed from the sealing resin.

In a preferable embodiment of the present invention, the base member has a substrate outer side surface that connects the main surface and the back surface together and is flush with the element exposed side surface of the semiconductor element.

In a preferable embodiment of the present invention, the sealing resin has a sealing resin outer surface flush with both the element exposed side surface of the semiconductor element and the substrate outer side surface of the base member.

In a preferable embodiment of the present invention, the element exposed side surface of the semiconductor element is perpendicular to the thickness direction of the substrate.

In a preferable embodiment of the present invention, the semiconductor element has a first main portion and a second main portion.

In a preferable embodiment of the present invention, the element exposed side surface is formed on the first main portion.

In a preferable embodiment of the present invention, the first main portion is formed of a semiconductor.

In a preferable embodiment of the present invention, the second main portion has a bonding surface on which the element pad is formed.

In a preferable embodiment of the present invention, the second main portion is formed of an insulating material.

In a preferable embodiment of the present invention, the second main portion is formed of a resin.

In a preferable embodiment of the present invention, the first main portion and the second main portion are arranged side by side in a direction in which the element exposed side surface faces.

In a preferable embodiment of the present invention, a dimension of the first main portion in the thickness direction of the substrate is greater than a dimension of the first main portion in a direction in which the element exposed side surface faces.

In a preferable embodiment of the present invention, a dimension of the second main portion in the thickness direction of the substrate is greater than a dimension of the second main portion in a direction in which the element exposed side surface faces.

In a preferable embodiment of the present invention, a dimension of the semiconductor element in the thickness direction of the substrate is greater than a dimension of the semiconductor element in a direction in which the element exposed side surface faces.

In a preferable embodiment of the present invention, the semiconductor element is bonded to the substrate by a bonding member.

In a preferable embodiment of the present invention, the bonding member is an insulating bonding member.

In a preferable embodiment of the present invention, the bonding member is a conductive bonding member.

In a preferable embodiment of the present invention, the bonding member has a bonding member exposed side surface flush with the element exposed side surface.

In a preferable embodiment of the present invention, the semiconductor element is a direction sensor element including a detection reference axis in the first main portion.

In a preferable embodiment of the present invention, the detection reference axis is parallel to the thickness direction of the substrate.

According to a second aspect of the present invention, there is provided a method for making a semiconductor device, the method includes steps of: mounting a semiconductor element on a main surface of a substrate, the semiconductor element having an element pad; bonding a wire to the element pad; forming a sealing resin covering the semiconductor element and the wire; and simultaneously cutting the substrate, the semiconductor element and the sealing resin.

In a preferable embodiment of the present invention, in the mounting the semiconductor element, the semiconductor element is bonded to the substrate by a bonding member, and in the cutting, the substrate, the semiconductor element, the sealing resin and the bonding member are simultaneously cut.

A semiconductor device provided according to a third aspect of the present invention includes: a semiconductor element having at least one element pad, and a wire having a bonding portion bonded to the element pad. The semiconductor element has a reference surface and a bonding surface, where the angle between the reference surface and the bonding surface is less than 180°, and at least a portion of the element pad is formed on the bonding surface. The reference surface and the bonding surface define a boundary therebetween, and the bonding surface has a separate edge located opposite to the boundary. The bonding portion of the wire is located closer to the separate edge of the bonding surface than to the boundary.

In a preferable embodiment of the present invention, the element pad has a portion formed on the reference surface.

In a preferable embodiment of the present invention, the element pad is formed by plating.

In a preferable embodiment of the present invention, the element pad has a portion that becomes thinner toward the boundary from the separate edge.

In a preferable embodiment of the present invention, the element pad has a main plating layer.

In a preferable embodiment of the present invention, the main plating layer is formed of Cu.

In a preferable embodiment of the present invention, the main plating layer has a portion that becomes thinner toward the boundary from the separate edge.

In a preferable embodiment of the present invention, the element pad has a top plating layer stacked on top of the main plating layer.

In a preferable embodiment of the present invention, the top plating layer has an average thickness smaller than an average thickness of the main plating layer.

In a preferable embodiment of the present invention, the top plating layer is formed of Au.

In a preferable embodiment of the present invention, the wire is formed of Au.

In a preferable embodiment of the present invention, the top plating layer has a portion that becomes thinner toward the boundary from the separate edge.

In a preferable embodiment of the present invention, the main plating layer has a portion that is closer to the boundary and is exposed from the top plating layer.

In a preferable embodiment of the present invention, the element pad has an underlying plating layer interposed between the main plating layer and the bonding surface.

In a preferable embodiment of the present invention, the underlying plating layer is formed of Cu.

In a preferable embodiment of the present invention, the semiconductor element has a retreat side surface extending from the separate edge in a direction opposite to a direction in which the bonding surface faces.

In a preferable embodiment of the present invention, the element pad has a portion formed on the retreat side surface.

In a preferable embodiment of the present invention, the semiconductor element has a first main portion and a second main portion that are separate and bonded together. The reference surface is formed by the first main portion. The bonding surface is formed by the second main portion.

In a preferable embodiment of the present invention, the first main portion and the second main portion are separate and bonded together.

In a preferable embodiment of the present invention, the first main portion is formed of a semiconductor.

In a preferable embodiment of the present invention, the second main portion is formed of an insulating material.

In a preferable embodiment of the present invention, the second main portion is formed of a resin.

In a preferable embodiment of the present invention, the first main portion and the second main portion are integrally formed.

In a preferable embodiment of the present invention, the semiconductor device includes a substrate including a base member having a main surface and a back surface facing opposite in a thickness direction, and an interconnect pattern formed on the base member and including the substrate pad. The semiconductor element is mounted on the main surface.

In a preferable embodiment of the present invention, the substrate has a substrate pad. The wire is bonded to the substrate pad.

In a preferable embodiment of the present invention, the semiconductor device includes an integrated circuit element mounted on the substrate.

In a preferable embodiment of the present invention, the integrated circuit element has an additional element pad. The wire is bonded to the additional element pad.

In a preferable embodiment of the present invention, the substrate has a recessed portion that is recessed from the main surface toward the back surface. A portion of the semiconductor element is accommodated in the recessed portion.

In a preferable embodiment of the present invention, the recessed portion has a bottom surface located between the main surface and the back surface in the thickness direction. The semiconductor element is bonded to the bottom surface.

In a preferable embodiment of the present invention, the recessed portion has an inner side surface connected to the main surface.

In a preferable embodiment of the present invention, the inner side surface is sloped with respect to the thickness direction.

In a preferable embodiment of the present invention, the recessed portion has a curved surface connecting the bottom surface and the inner side surface.

In a preferable embodiment of the present invention, the interconnect pattern has a middle layer located between the main surface and the back surface in the thickness direction. The middle layer has a blocking port ion forming the bottom surf ace of the recessed portion.

In a preferable embodiment of the present invention, the blocking portion is larger than the bottom surface as viewed in the thickness direction.

In a preferable embodiment of the present invention, the base member has a portion located closer to the back surface relative to the middle layer.

In a preferable embodiment of the present invention, the interconnect pattern has a plurality of back surface electrodes exposed toward the back surface.

In a preferable embodiment of the present invention, any of the plurality of back surface electrodes coincides with the blocking portion of the middle layer as viewed in the thickness direction.

In a preferable embodiment of the present invention, the blocking portion and the plurality of back surface electrodes are insulated from each other.

In a preferable embodiment of the present invention, the semiconductor element is a direction sensor element including a detection reference axis in the first main portion.

A semiconductor device provided according to a fourth aspect of the present invention includes a substrate, and a direction sensor element having a detection reference axis. The substrate has at least one substrate pad facing in one direction along a thickness direction. The direction sensor element has a semiconductor portion including the detection reference axis, and an auxiliary portion bonded to the semiconductor portion. The auxiliary portion has a pad surface facing the substrate pad. The semiconductor portion has a reference surface extending from an edge of the pad surface toward the substrate. The direction sensor element has an element pad having at least a portion formed on the pad surface. The element pad and the substrate pad are bonded together by a conductive bonding member.

In a preferable embodiment of the present invention, the element pad extends from the pad surface to the reference surface.

In a preferable embodiment of the present invention, the conductive bonding member is bonded to a portion of the element pad that is formed on the reference surface.

In a preferable embodiment of the present invention, the pad surface has a separate edge located on an opposite side from the reference surface. The auxiliary portion has a retreat side surface extending from the separate edge in a direction away from the substrate. The element pad has a portion formed on the retreat side surface.

In a preferable embodiment of the present invention, the conductive bonding member is bonded to a portion of the element pad that is formed on the retreat side surface.

In a preferable embodiment of the present invention, the semiconductor portion has a bonding surface bonded to the substrate.

In a preferable embodiment of the present invention, the bonding surface is perpendicular to the reference surface.

In a preferable embodiment of the present invention, the bonding surface is perpendicular to the detection reference axis.

In a preferable embodiment of the present invention, the substrate includes a base member having a main surface and a back surface facing in opposite directions along a thickness direction, and an interconnect pattern formed on the base member and including the substrate pad. The substrate pad is formed on the main surface.

In a preferable embodiment of the present invention, the semiconductor device further includes an integrated circuit element mounted on the substrate. The interconnect pattern is electrically connected to the substrate pad, and has an additional substrate pad electrically connected to the integrated circuit element.

In a preferable embodiment of the present invention, the integrated circuit element and the additional substrate pad are electrically connected together through a wire.

In a preferable embodiment of the present invention, the integrated circuit element and the additional substrate pad are electrically connected together through a conductive bonding member.

In a preferable embodiment of the present invention, the auxiliary portion is located on the same side of the semiconductor portion where the integrated circuit element is provided.

In a preferable embodiment of the present invention, the auxiliary portion is located on an opposite side of the semiconductor portion from the integrated circuit element.

In a preferable embodiment of the present invention, the substrate has a recessed portion that is recessed from the main surface toward the back surface. A portion of the semiconductor portion is accommodated in the recessed portion.

In a preferable embodiment of the present invention, the recessed portion has a bottom surface located between the main surface and the back surface in the thickness direction. The semiconductor portion is bonded to the bottom surface.

In a preferable embodiment of the present invention, the recessed portion has an inner side surface connected to the main surface.

In a preferable embodiment of the present invention, the inner side surface is sloped with respect to the thickness direction.

In a preferable embodiment of the present invention, the recessed portion has a curved surface connecting the bottom surface and the inner side surface together.

In a preferable embodiment of the present invention, the interconnect pattern has a middle layer located between the main surface and the back surface in the thickness direction. The middle layer has a blocking portion forming the bottom surface of the recessed portion.

In a preferable embodiment of the present invention, the blocking portion is larger than the bottom surface as viewed in the thickness direction.

In a preferable embodiment of the present invention, the base member has a portion located closer to the back surface relative to the middle layer.

In a preferable embodiment of the present invention, the interconnect pattern has a plurality of back surface electrodes exposed toward the back surface.

In a preferable embodiment of the present invention, any of the plurality of back surface electrodes coincides with the blocking portion of the middle layer as viewed in the thickness direction.

In a preferable embodiment of the present invention, the blocking portion and the plurality of back surface electrodes are insulated from each other.

In a preferable embodiment of the present invention, the semiconductor device includes at least one additional direction sensor element having a detection reference axis for a direction different from that of the detection reference axis of the direction sensor element.

In a preferable embodiment of the present invention, the additional direction sensor element is mounted in the integrated circuit element.

Other features and advantages of the present invention will be apparent from a reading of the following detailed description and a review of the associated drawings.

DESCRIPTION OF THE PREFERRED EMBODIMENTS

Figure 1:
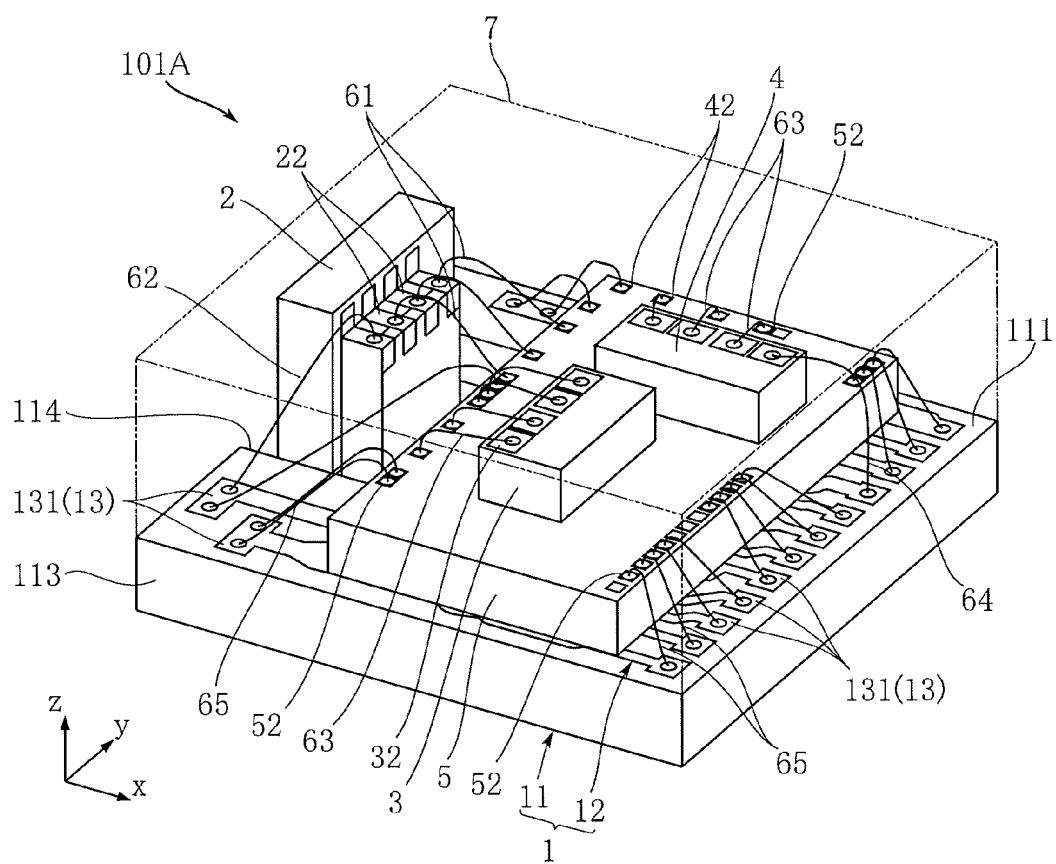
FIG. 1 is a perspective view showing a semiconductor device based on a first embodiment of the present invention.

Preferred embodiments of the present invention will now be specifically described with reference to the accompanying drawings.

FIGS. 1 to 8 show a semiconductor device according to a first embodiment of the present invention. The semiconductor device 101A of this embodiment includes a substrate 1, a first direction sensor element 2, a second direction sensor element 3, a third direction sensor element 4, an integrated circuit element 5, a first wire(s) 61, a second wire(s) 62, a third wire(s) 63, a fourth wire(s) 64, a fifth wire(s) 65, and a sealing resin 7. The semiconductor device 101A is configured to detect an orientation with respect to three axes, i.e., an x-axis, y-axis, and z-axis, in three-dimensional space by utilizing geomagnetism, and output the detection result as an electrical signal. In this embodiment, the semiconductor device 101A has a cuboidal shape, and for example, is about 2.0 mm long in the x- and y-directions and about 0.8 mm long in the z-direction.

Figure 2:
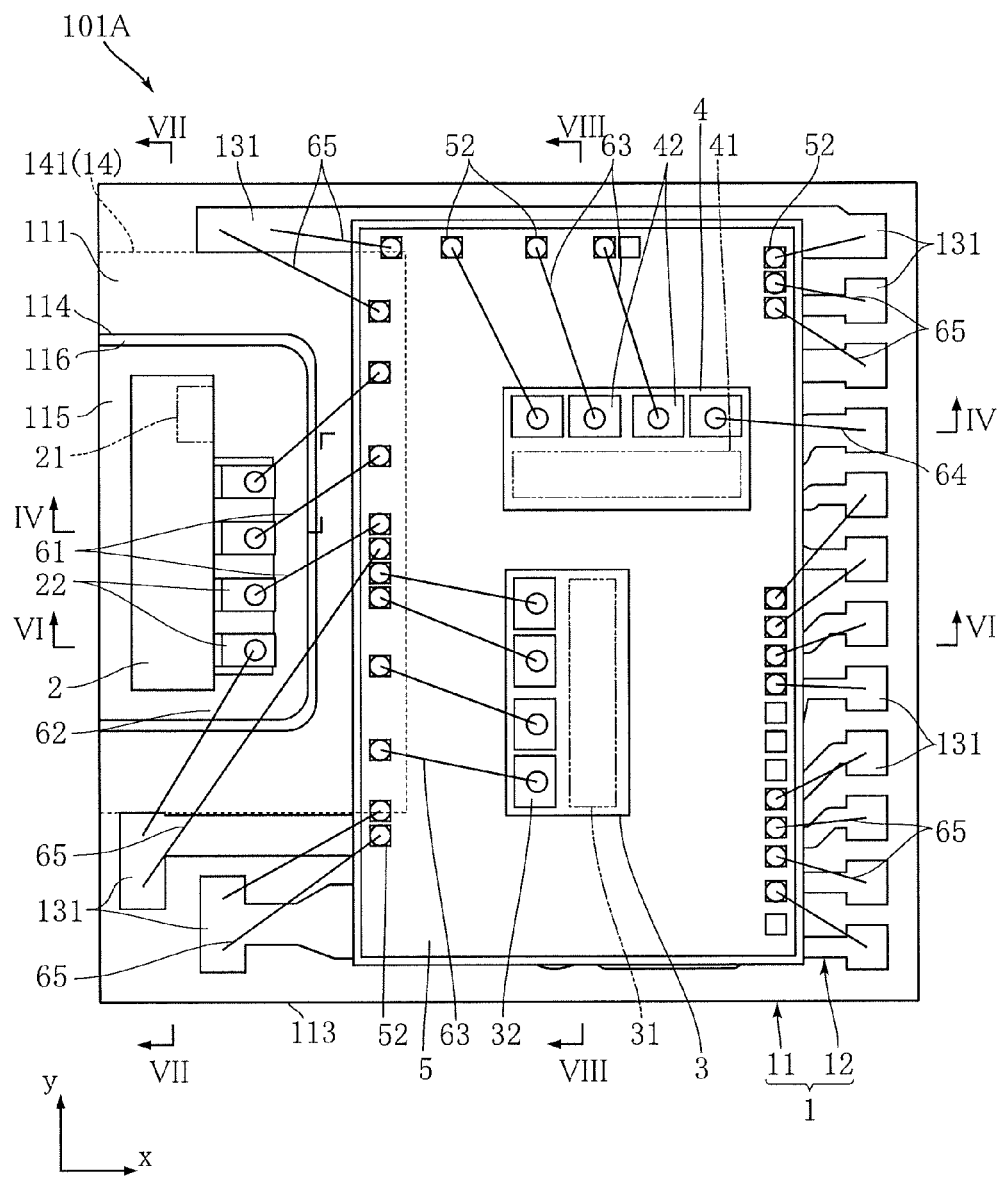
FIG. 2 is a plan view showing main parts of the semiconductor device of FIG. 1.
Figure 3:
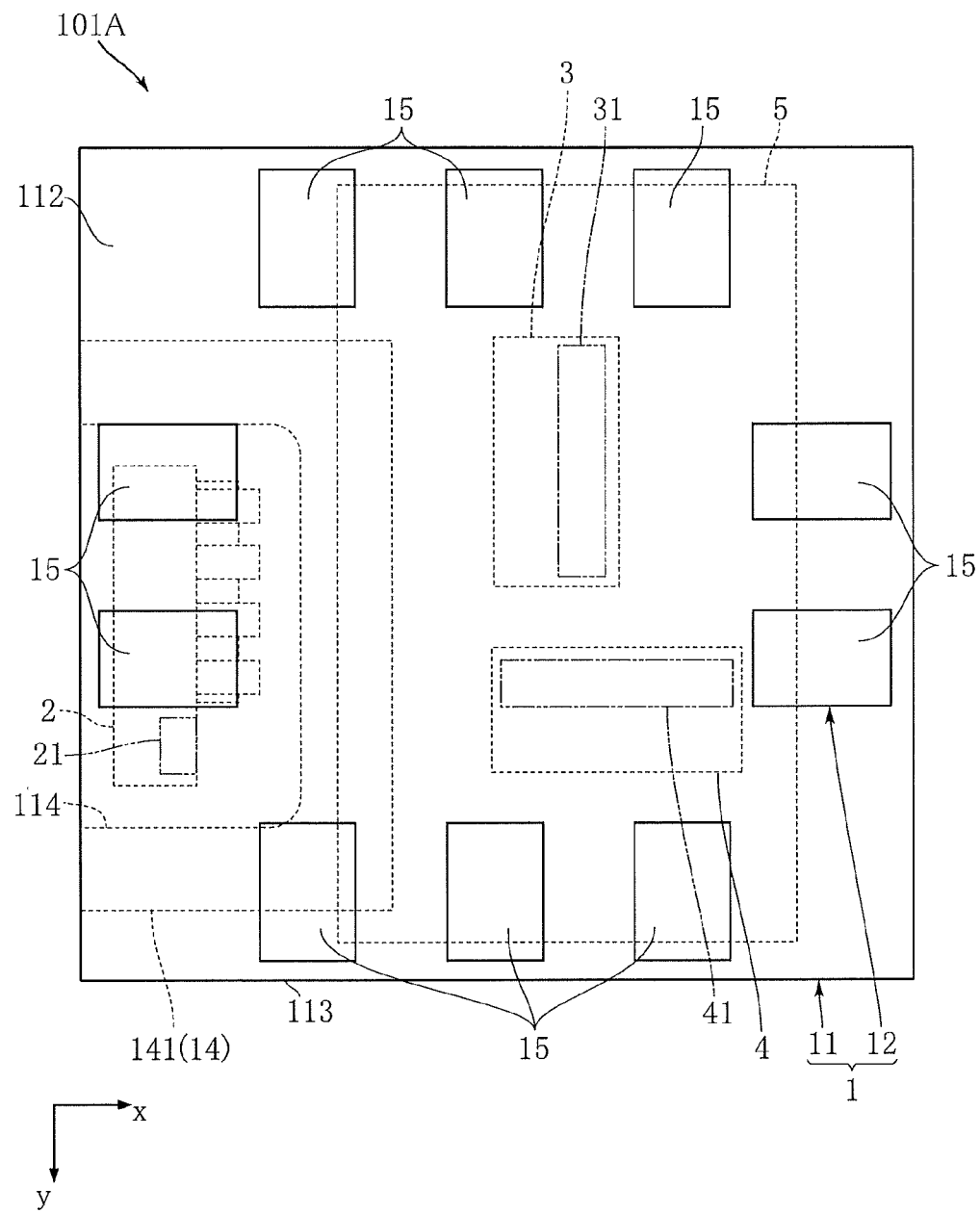
FIG. 3 is a bottom view showing the semiconductor device of FIG. 1.
Figure 4:
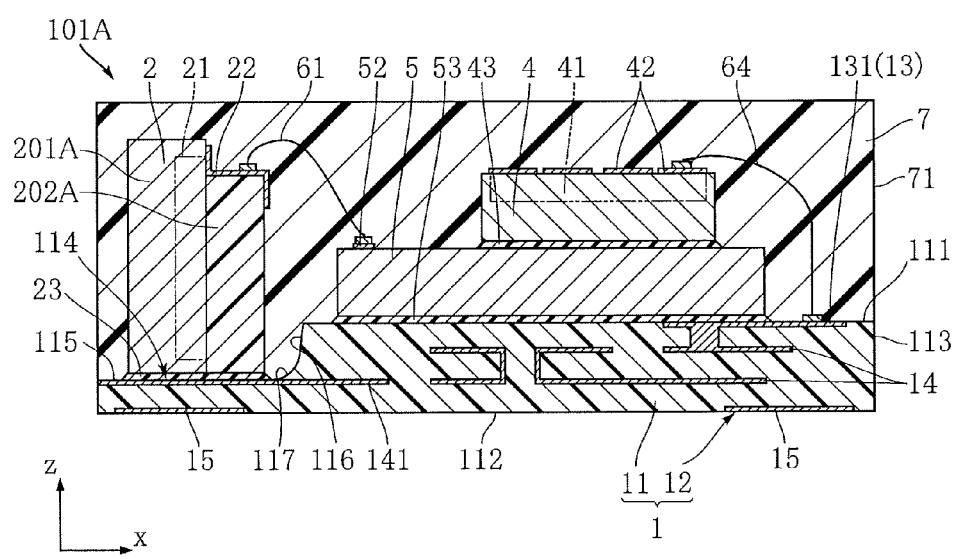
FIG. 4 is a cross-sectional view taken along line IV-IV of FIG. 2.
Figure 5:
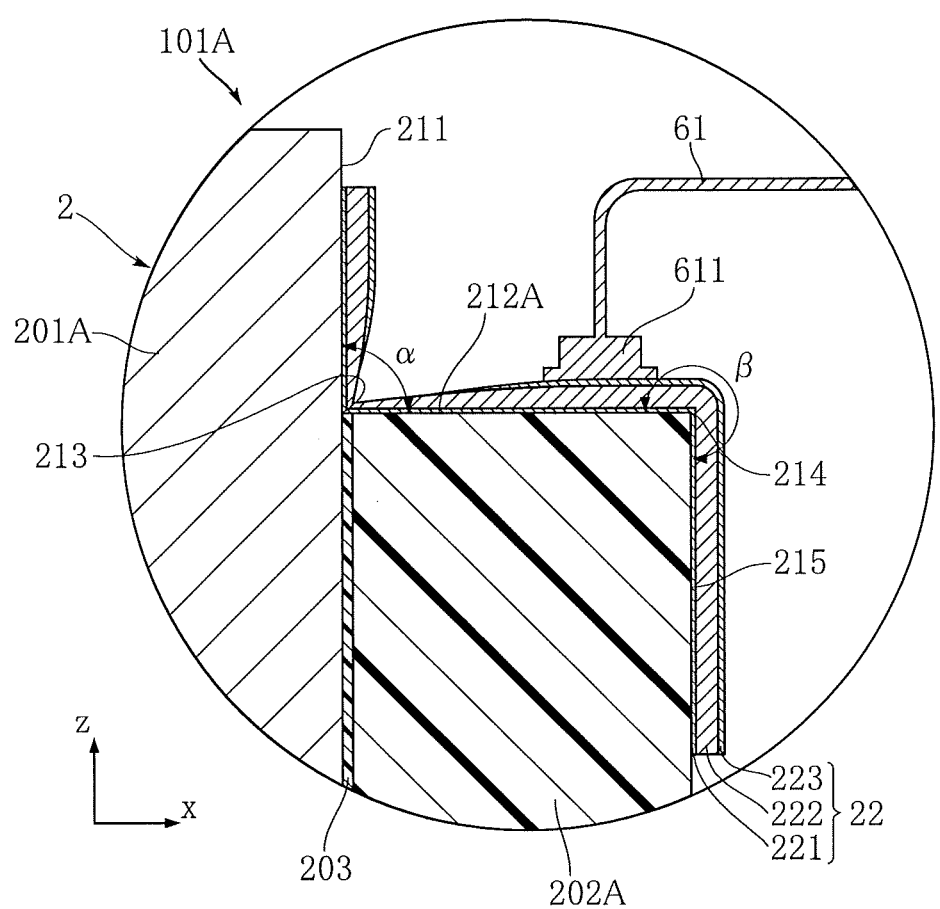
FIG. 5 is an enlarged cross-sectional view of main parts of the semiconductor device of FIG. 1.
Figure 6:
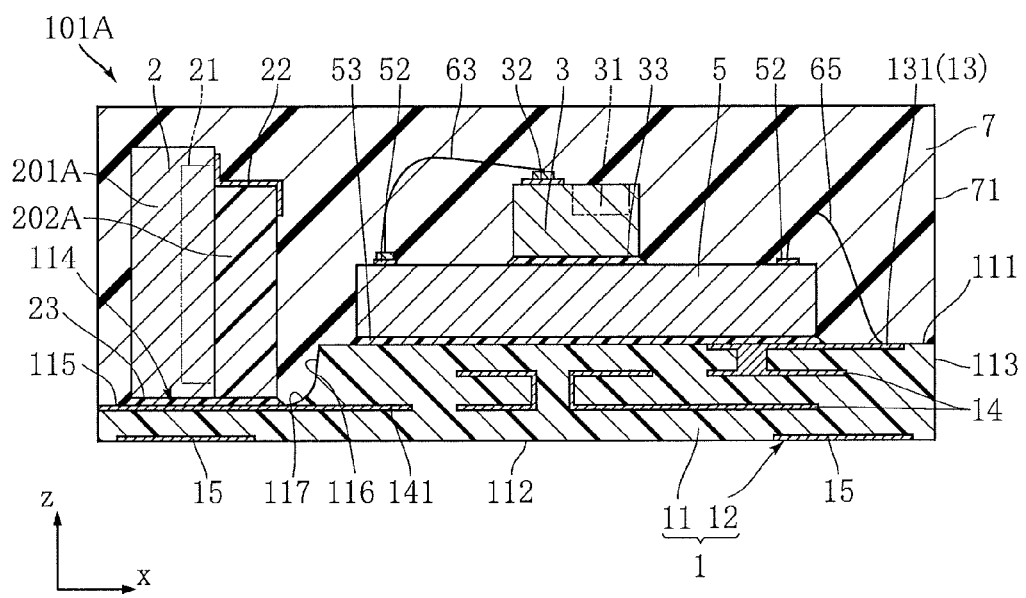
FIG. 6 is a cross-sectional view taken along line VI-VI of FIG. 2.
Figure 7:
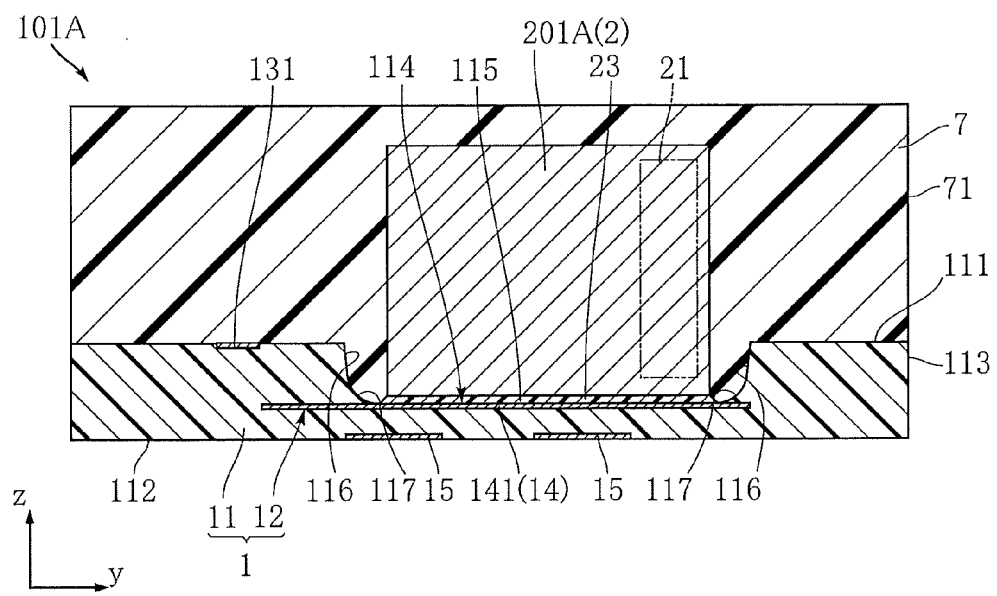
FIG. 7 is a cross-sectional view taken along line VII-VII of FIG. 2.
Figure 8:
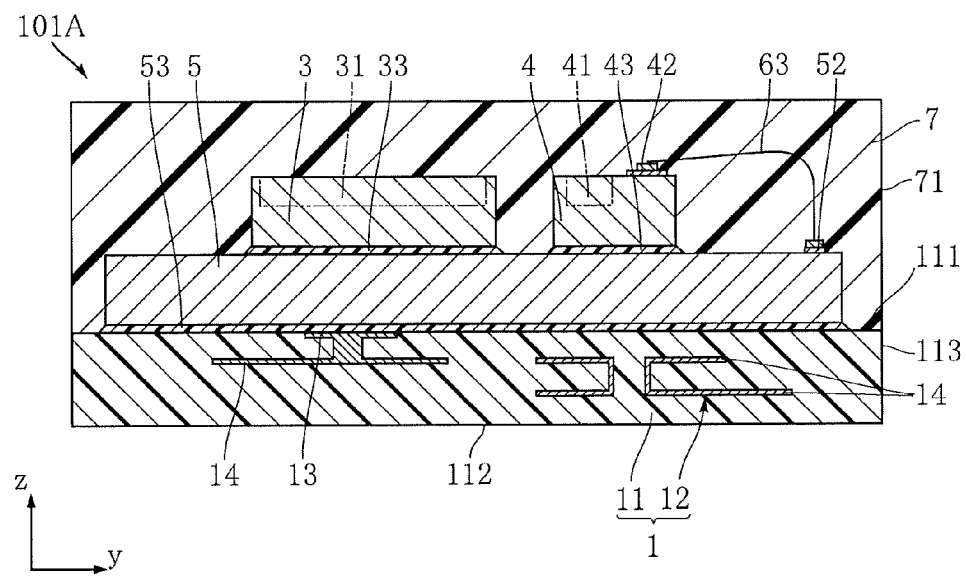
FIG. 8 is a cross-sectional view taken along line VIII-VIII of FIG. 2.
Figure 9:
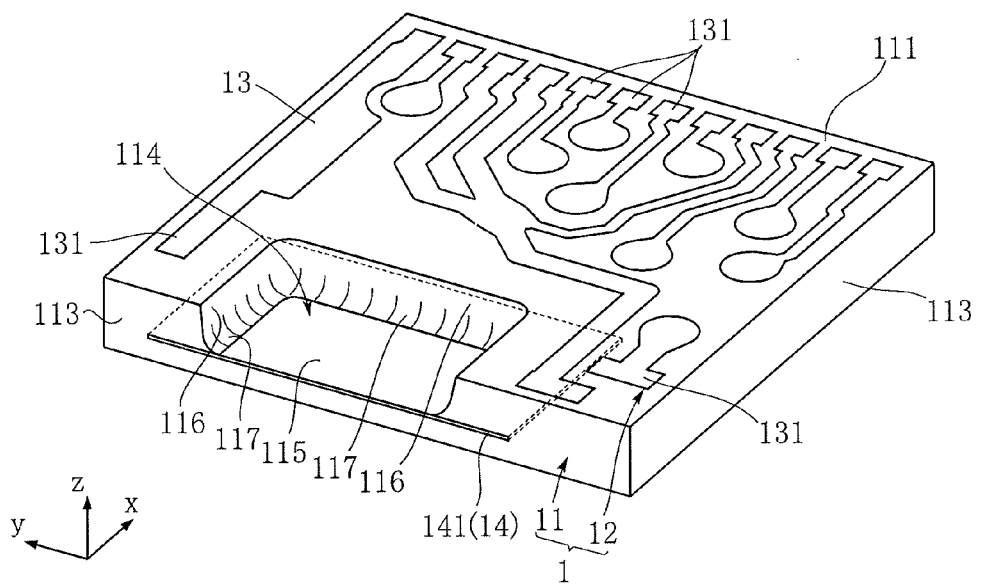
FIG. 9 is a perspective view showing a substrate used in the semiconductor device of FIG. 1.

FIG. 1 is a perspective view showing the semiconductor device 101A. FIG. 2 is a plan view showing main parts of the semiconductor device 101A. FIG. 3 is a bottom view showing the semiconductor device 101A. FIG. 4 is a cross-sectional view taken along a zx plane of section line IV-IV of FIG. 2. FIG. 5 is an enlarged cross-sectional view of main parts shown in FIG. 4. FIG. 6 is a cross-sectional view taken along a zx plane of section line VI-VI of FIG. 2. FIG. 7 is a cross-sectional view taken along a yz plane of section line VII-VII of FIG. 2. FIG. 8 is a cross-sectional view taken along a yz plane of section line VIII-VIII of FIG. 2. Note that, for ease of understanding, the sealing resin 7 is shown using an imaginary line in FIG. 1, and the sealing resin 7 is not shown in FIG. 2.

The substrate 1 supports the first direction sensor element 2, the second direction sensor element 3, the third direction sensor element 4, and the integrated circuit element 5, and is a base of the semiconductor device 101A. In this embodiment, the substrate 1 includes a base member 11 and an interconnect pattern 12. The substrate 1 also has a main surface 111, a back surface 112, substrate outer side surfaces 113, and a recessed portion 114. In this embodiment, the substrate 1 has a rectangular shape, and for example, is about 2.0 mm long in the x- and y-directions and about 0.23 mm long in the z-direction.

The main surface 111 and the back surface 112 face in opposite directions along the z-direction, which is a thickness direction of the substrate 1. The main surface 111 is a surface facing upward along the z-direction, and the back surface 112 is a surface facing downward along the z-direction. The substrate outer side surfaces 113 connect the main surface 111 and the back surface 112 together, and in this embodiment, face in the x- and y-directions and are parallel to the z-direction.

The recessed portion 114 is recessed from the main surface 111 toward the back surface 112. In this embodiment, as can be clearly seen from FIG. 2, the recessed portion 114 is formed at a left end in the x-direction of the substrate 1, and is open only leftward along the x-direction and closed rightward along the x-direction and in opposite directions along the y-direction, i.e., three directions. The recessed portion 114 is generally rectangular as viewed in the z-direction, and for example, about 0.5 mm long in the x-direction, about 1.0 mm long in the y-direction, and about 0.15 mm deep in the z-direction.

FIGS. 9 to 12 show only the substrate 1 used in the semiconductor device 101A. As shown in these figures, the recessed portion 114 has a bottom surface 115, an inner side surface 116, and a curved surface 117. The bottom surface 115 is located between the main surface 111 and the back surface 112 in the z-direction, facing upward along the z-direction. In this embodiment, the bottom surface 115 is a flat and smooth surface. The inner side surface 116 is connected to the main surface 111, and in this embodiment, has a squared-C shape as viewed in the z-direction. In this embodiment, the inner side surface 116 is sloped with respect to the z-direction so that the inner side surface 116 becomes more distant from the middle of the bottom surface 115 as viewed from above, upward along the z-direction. The inner side surface 116 connects the inner side surface 116 and the bottom surface 115 together, and is a concave curved surface.

The base member 11 is formed of an insulating material, and in this embodiment, is formed of, for example, glass epoxy resin. The interconnect pattern 12 is formed of a metal, and for example, has a structure in which layers of Cu, Ni, and Au are stacked. The interconnect pattern 12 has a main surface layer 13, a middle layer 14, and a plurality of back surface electrodes 15. The substrate 1 is a multilayer substrate which is a stack of the base member 11, and the main surface layer 13, the middle layer 14 and the back surface electrodes 15.

The main surface layer 13 is exposed toward the main surface 111, and has a plurality of substrate pads 131. Band-shaped portions that form conduction channels extend from the substrate pads 131. In this embodiment, the substrate pads 131 are located in the vicinity of a right side in the x-direction of the base member 11 and two opposite sides in the y-direction of the base member 11.

The middle layer 14 is provided inside the base member 11 in the z-direction. In this embodiment, two middle layers 14 are provided that are separated from each other in the z-direction. The middle layers 14 and the main surface layer 13 are electrically connected to the back surface electrodes 15, at appropriate portions thereof, by a portion (called a through-hole electrode or via electrode) that penetrates through a portion of the base member 11 in the z-direction.

One of the two middle layers 14 that is located at a lower position in the z-direction, has a blocking portion 141. The blocking portion 141 is larger than the recessed portion 114, covering all the recessed portion 114, as viewed in the z-direction. Also, an upper surface in the z-direction of the blocking portion 141 forms all the bottom surface 115 of the recessed portion 114. In this embodiment, the blocking portion 141 has a rectangular shape. Also, the blocking portion 141 is not electrically connected to any portions of the interconnect pattern 12 other than the blocking portion 141, and the blocking portion 141 is insulated from these portions.

The back surface electrodes 15 are exposed toward the back surface 112, and are used when the semiconductor device 101A is mounted on, for example, the circuit substrate or the like. As shown in FIG. 3, in this embodiment, eight back surface electrodes 15 are provided along the four sides of the base member 11. Also, two left back surface electrodes 15 in the x-direction in the figure coincide with the blocking portion 141 of the interconnect pattern 12 as viewed in the z-direction, and are located below the blocking portion 141 in the z-direction.

Here, a method for making the substrate 1 will be described with reference to FIGS. 13 and 14.

Figure 13:
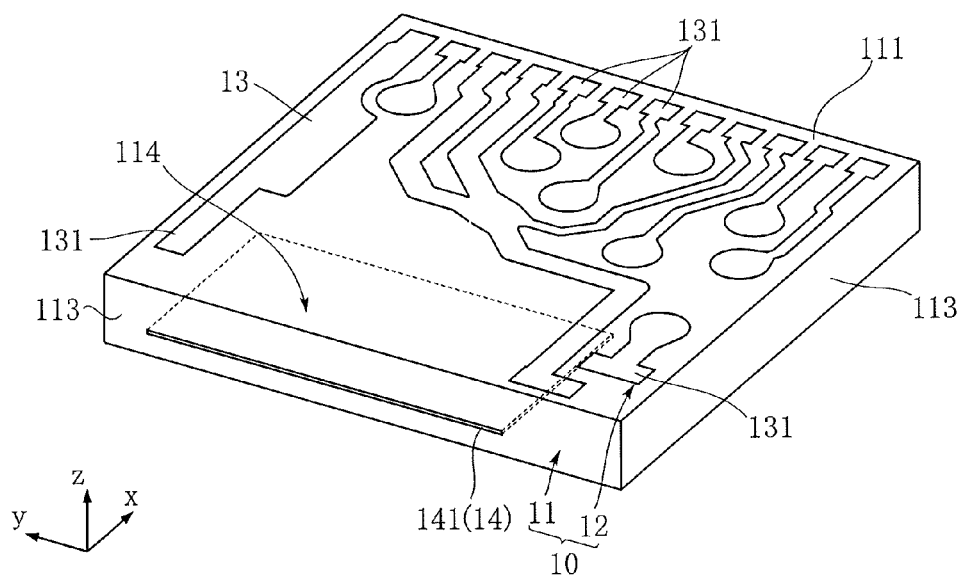
FIG. 13 is a perspective view showing a substrate material used in making the substrate of FIG. 9.

FIG. 13 is a perspective view showing a substrate material 10 used in making the substrate 1. The substrate material 10 has a base member 11 and an interconnect pattern 12. The base member 11 and the interconnect pattern 12 have a configuration similar to that described above. Note that the recessed portion 114 has not yet been formed in the substrate material 10. Therefore, the base member 11 has a uniform thickness. Also, the blocking portion 141 of the interconnect pattern 12 is provided in the base member 11, and an upper surface thereof in the z-direction is covered by the substrate material 10. Note that FIG. 13 shows only a portion of the substrate material 10 that will form the substrate 1. For example, the substrate 1 may be made using a substrate material 10 that is larger than the substrate material 10 shown in FIG. 13. In this case, for example, it is preferable to employ a larger blocking portion 141 that extends leftward along the x-direction.

Figure 14:
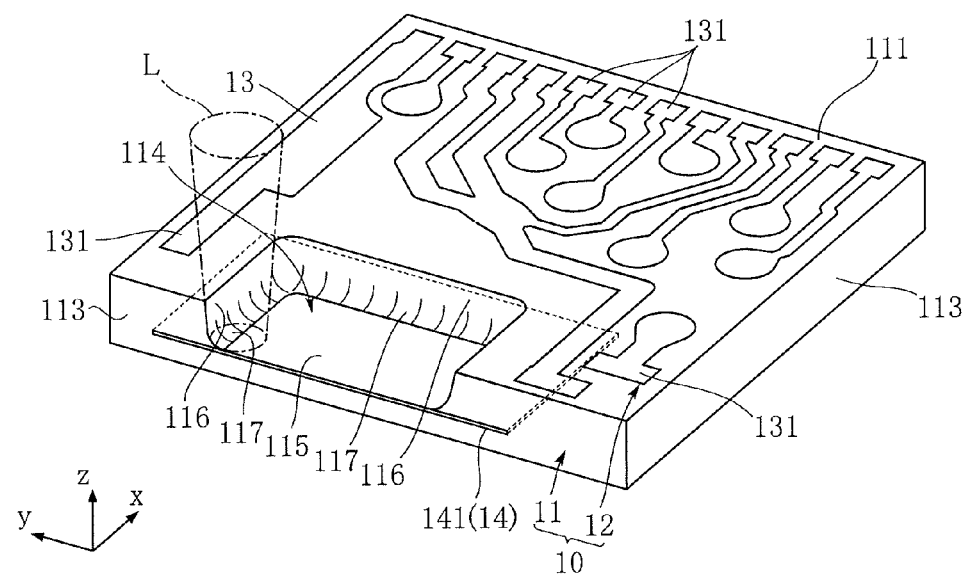
FIG. 14 is a perspective view showing a step of removing a portion of a base member in the substrate making step of FIG. 9.
Figure 15:
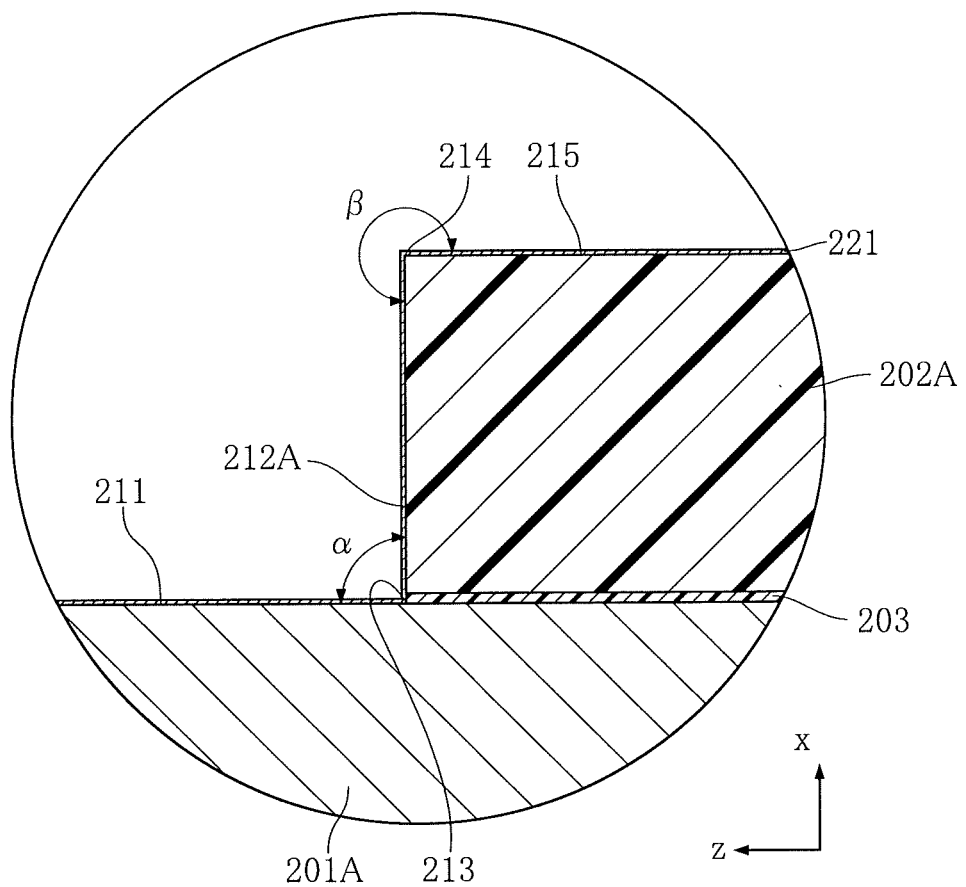
FIG. 15 is an enlarged cross-sectional view of main parts showing a step of making a direction sensor element for the semiconductor device of FIG. 1.

Next, as shown in FIG. 14, the base member 11 is irradiated with laser light L from the side where the main surface 111 is located. The laser light L has a wavelength that allows the light L to be absorbed by the base member 11. A portion of the base member 11 that is irradiated with the laser light L is instantaneously heated to a high temperature due to absorption of the laser light L and thereby removed. The irradiation with the laser light L is applied to a region of the base member 11 that coincides with the blocking portion 141 as viewed in the z-direction and whose area is smaller than that of the blocking portion 141. The blocking portion 141 is formed of a metal, i.e., a material that relatively reflects the laser light L. For example, when the laser light L is YAG laser, the blocking portion 141 is preferably formed of Cu. Thus, only the base member 11 is removed by the laser light L, so that the blocking portion 141 is exposed. As a result, the recessed portion 114 is formed. Also, an upper surface in the z-direction of the blocking portion 141 forms the bottom surface 115 of the blocking portion 141.

The laser light L is focused onto the base member 11 by an optical system (not shown). Therefore, the laser light L typically has a conical shape that becomes narrower downward. Therefore, an inner side surface 116 that is sloped with respect to the z-direction is formed in the recessed portion 114, corresponding to the conical shape of the laser light L. Also, a gently curved surface 117 is formed between the inner side surface 116 and the bottom surface 115.

The integrated circuit element 5 is provided to control a direction detection process using the first direction sensor element 2, the second direction sensor element 3, and the third direction sensor element 4. In this embodiment, the integrated circuit element 5 is configured as a so-called application specific integrated circuit (ASIC) element, and has a thickness of about 80 to 100 μm.

The integrated circuit element 5 is supported by the main surface 111 of the substrate 1 and is bonded to the main surface 111 by a bonding member 53. The integrated circuit element 5 is entirely covered by the main surface 111 and does not overlap the recessed portion 114 as viewed in the z-direction.

A plurality of element pads 52 are formed on an upper surface in the z-direction in the figure of the integrated circuit element 5. The element pads 52 has, for example, a surface formed of Au, and in this embodiment, are arranged along three of the four sides of the integrated circuit element 5 as viewed in the z-direction.

The first direction sensor element 2, the second direction sensor element 3, and the third direction sensor element 4 have different detection reference axes along different directions, and are used to detect an orientation of the semiconductor device 101A with respect to geomagnetism, for example. In this embodiment, the first direction sensor element 2 has a magnetic material wire 21, the second direction sensor element 3 has a magnetic material wire 31, and the third direction sensor element 4 has a magnetic material wire 41. The magnetic material wire 21, the magnetic material wire 31, and the magnetic material wire 41 are a bar-like member formed of a metal extending in a predetermined direction. Longitudinal directions of these wires correspond to the above detection reference axes of the first direction sensor element 2, the second direction sensor element 3, and the third direction sensor element 4. The first direction sensor element 2, the second direction sensor element 3, and the third direction sensor element 4 further have coils (not shown) formed around the magnetic material wire 21, the magnetic material wire 31, and the magnetic material wire 41. The first direction sensor element 2, the second direction sensor element 3, and the third direction sensor element 4 are about 0.6 mm long, for example, in directions in which the magnetic material wire 21, the magnetic material wire 31, and the magnetic material wire 41 are extended.

The first direction sensor element 2 is bonded to the bottom surface 115 of the blocking portion 141 by a bonding member 23. The first direction sensor element 2 is mounted and oriented so that the magnetic material wire 21 is parallel to the z-direction. Such a mounted form causes a lower portion of the first direction sensor element 2 to coincide with the blocking portion 141 in the z-direction, and to be accommodated in the blocking portion 141. An upper portion in the z-direction of the first direction sensor element 2 protrudes upward along the z-direction from the blocking portion 141. Four element pads 22 are formed on the first direction sensor element 2. The four element pads 22 are located slightly below an upper end in the z-direction of the first direction sensor element 2, and have a portion facing upward along the z-direction. Note that the first direction sensor element 2 corresponds to an example of the semiconductor element according to the first aspect of the present invention.

In this embodiment, the first direction sensor element 2 includes a first main portion 201A and a second main portion 202A. The first main portion 201A is formed of a semiconductor, such as Si or the like, and includes the magnetic material wire 21. The second main portion 202A is formed of an insulating material, such as a resin or the like. The first main portion 201A and the second main portion 202A are separate portions, and as shown in FIG. 5, are bonded together by a bonding member 203.

The first direction sensor element 2 has a reference surface 211, a bonding surface 212A, and a retreat side surface 215. The reference surface 211 is parallel to the yz plane and faces rightward along the x-direction in FIG. 5. The reference surface 211 is formed by the first main portion 201A. The bonding surface 212A is parallel to the xy plane and faces upward along the z-direction in FIG. 5. The bonding surface 212A is formed by the second main portion 202A. An angle α between the reference surface 211 and the bonding surface 212A is 90° in this example. Note that, in the present invention, the angle α is set to be less than 180°. A boundary 213 is set between the reference surface 211 and the bonding surface 212A. The boundary 213 substantially separates the reference surface 211 from the bonding surface 212A, and is not limited to one that is formed only by the reference surface 211 and the bonding surface 212A. For example, in the example shown, the boundary 213 is formed by the bonding member 203.

A separate edge 214 is set on an opposite side of the bonding surface 212A from the boundary 213. The separate edge 214 is an edge separate from the boundary 213. The retreat side surface 215 extends from the separate edge 214 in a direction opposite to a direction in which the bonding surface 212A faces, i.e., downward along the z-direction in FIG. 5. An angle β between the bonding surface 212A and the retreat side surface 215 is 270° in this example. Note that, in the present invention, the angle β is set to be more than 180°.

As shown in FIG. 5, the element pad 22 has a portion that is formed on the bonding surface 212A. Moreover, in this example, the element pad 22 is formed in a region extending from the boundary 213 to the separate edge 214 in the x-direction. Also, the element pad 22 has a portion formed on the reference surface 211. The portion of the element pad 22 that is formed on the reference surface 211 extends from the boundary 213 upward along the z-direction. As a result, the boundary 213 is covered by the element pad 22. In this example, the element pad 22 does not reach an upper end in the z-direction of the first main portion 201A. Also, the element pad 22 has a portion that is formed on the retreat side surface 215. The portion of the element pad 22 that is formed on the retreat side surface 215 extends from the separate edge 214 downward along the z-direction. As a result, the separate edge 214 is covered by the element pad 22.

In this example, the element pad 22 has a configuration in which an underlying plating layer 221, a main plating layer 222, and a top plating layer 223 are stacked together. The underlying plating layer 221 is a layer that is formed directly on the first main portion 201A and the second main portion 202A, and is formed of, for example, Cu. The underlying plating layer 221 is formed by, for example, electroless plating. The underlying plating layer 221 has a thickness of, for example, 0.5 μm to 5 μm. The main plating layer 222 is provided on top of the underlying plating layer 221, and is formed of, for example, Cu. The main plating layer 222 is formed by, for example, electroplating. The main plating layer 222 has a thickness of, for example, 7 μm to 20 μm. The top plating layer 223 is provided on top of the main plating layer 222, and is formed of, for example, Au. The top plating layer 223 is formed by, for example, electroplating. The top plating layer 223 has a thickness of, for example, 0.1

μm to 3 μm. In other words, the top plating layer 223 has an average thickness smaller than that of the main plating layer 222.

A portion of the element pad 22 that is formed on the bonding surface 212A has a portion that becomes thinner toward the boundary 213 from the separate edge 214 along the x-direction. This encompasses a configuration in which all the portion of the element pad 22 that is formed on the bonding surface 212A becomes thinner toward the boundary 213 from the separate edge 214 along the X-direction. Also, a portion of the element pad 22 that is formed on the reference surface 211 has a portion that becomes thinner toward the boundary 213 along the z-direction. In the example of FIG. 5, the thickness of the element pad 22 changes significantly at a portion in the vicinity of the boundary 213. On the other hand, a portion of the element pad 22 that is formed on the retreat side surface 215 has substantially a uniform thickness.

The underlying plating layer 221 has relatively small variations in its thickness. Portions of the main plating layer 222 that are formed on the bonding surface 212A and the reference surface 211 each have a portion that becomes thinner toward the boundary 213. Also, portions of the top plating layer 223 that are formed on the bonding surface 212A and the reference surface 211 each have a portion that becomes thinner toward the boundary 213. In particular, in the example of FIG. 5, the thickness of the top plating layer 223 is substantially zero in a region extending to a position slightly away from the boundary 213 in the x- and z-directions. As a result, the main plating layer 222 is exposed from the top plating layer 223.

Here, an example process of making the element pad 22 will now be described with reference to FIGS. 15 to 20.

Initially, the second main portion 202A is bonded to the first main portion 201A including the magnetic material wire 21 by the bonding member 203. In the example shown, the first main portion 201A has such a size that the first direction sensor elements 2 can be formed therein. Next, the underlying plating layer 221 of Cu is formed in a region including the reference surface 211, the bonding surface 212A, and the retreat side surface 215 by, for example, electroless plating.

Figure 16:
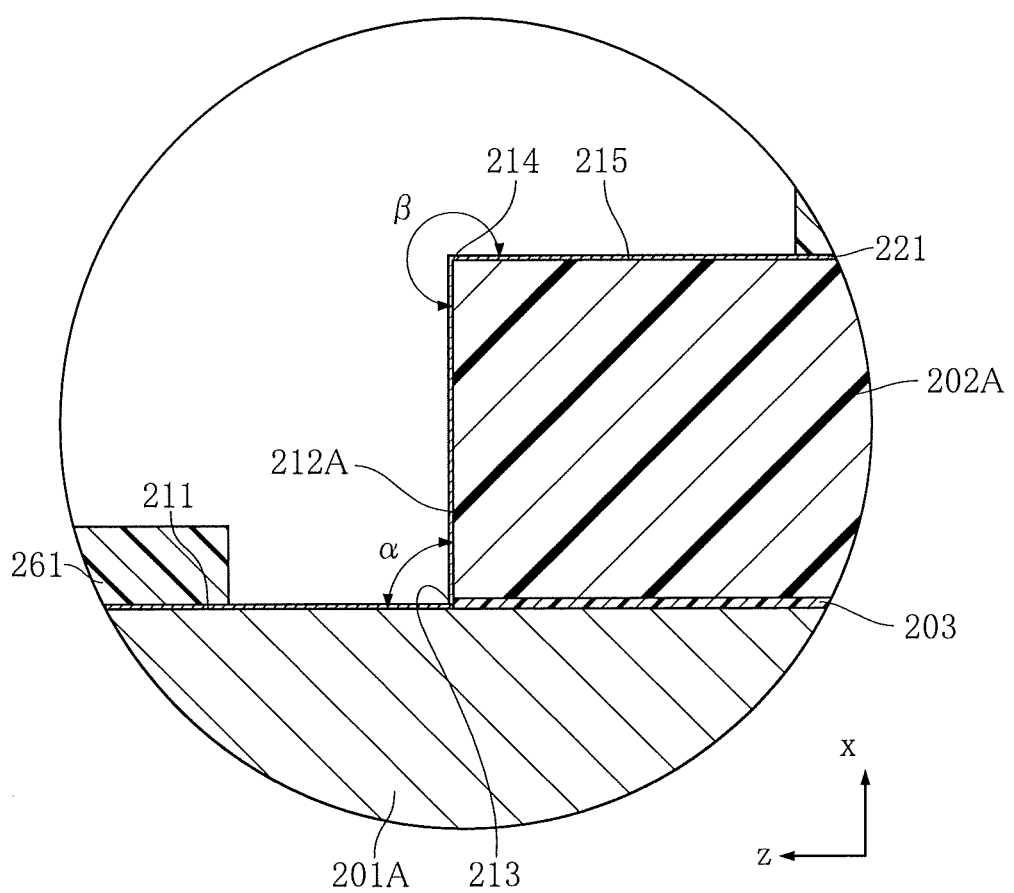
FIG. 16 is an enlarged cross-sectional view of main parts showing a step of making the direction sensor element for the semiconductor device of FIG. 1.

Next, as shown in FIG. 16, a mask layer 261 is formed. A portion of the underlying plating layer 221 is exposed from the mask layer 261.

Figure 17:
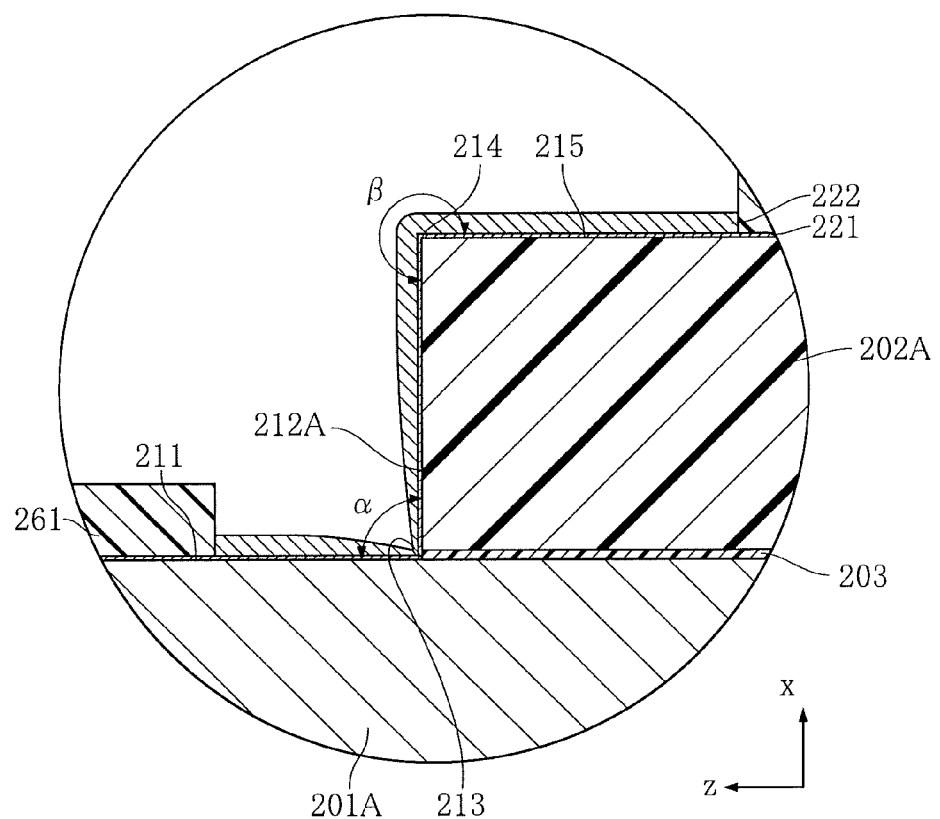
FIG. 17 is an enlarged cross-sectional view of main parts showing a step of making the direction sensor element for the semiconductor device of FIG. 1.

Next, as shown in FIG. 17, the main plating layer 222 is formed. The main plating layer 222 is formed by forming a layer of Cu on a portion of the underlying plating layer 221 that is exposed from the mask layer 261 by, for example, electroplating using the underlying plating layer 221. At this time, a plating solution for electroplating can be held in the vicinity of the boundary 213 due to the angle α of 90° in this example. The plating solution thus held results in formation of the main plating layer 222 having a portion that becomes thinner toward the boundary 213. On the other hand, the plating solution is not substantially held on the retreat side surface 215, and therefore, the main plating layer 222 has substantially a uniform thickness.

Figure 18:
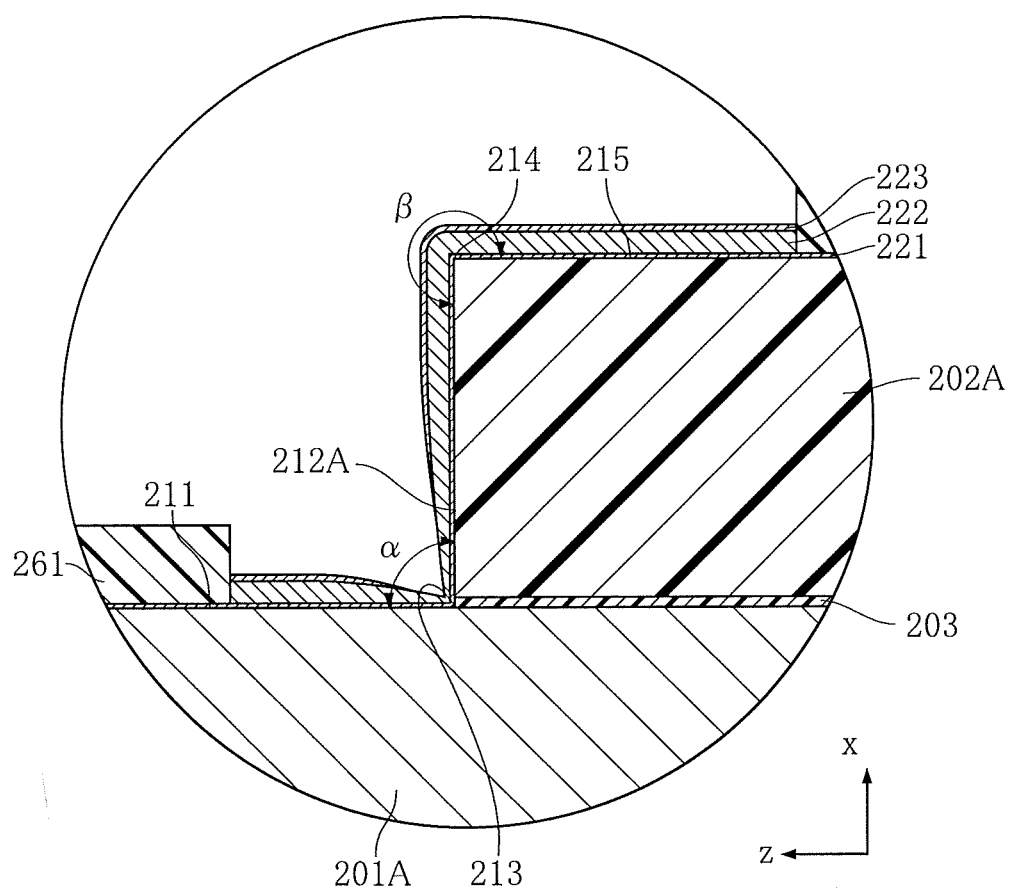
FIG. 18 is an enlarged cross-sectional view of main parts showing a step of making the direction sensor element for the semiconductor device of FIG. 1.

Next, as shown in FIG. 18, the top plating layer 223 is formed. The top plating layer 223 is formed by forming a layer of Au on the main plating layer 222 by, for example, electroplating using the underlying plating layer 221 and the main plating layer 222. At this time, a plating solution for electroplating can be held in the vicinity of the boundary 213 due to the angle α of 90° in this example. The plating solution thus held results in formation of the top plating layer 223 having a portion that becomes thinner toward the boundary 213. The thickness distribution of the top plating layer 223 depends on plating conditions, such as the degree of convection of the plating solution and the like. In this example, the thickness of the top plating layer 223 is substantially zero in the vicinity of the boundary 213, and therefore, a portion of the main plating layer 222 can be exposed from the top plating layer 223.

Figure 19:
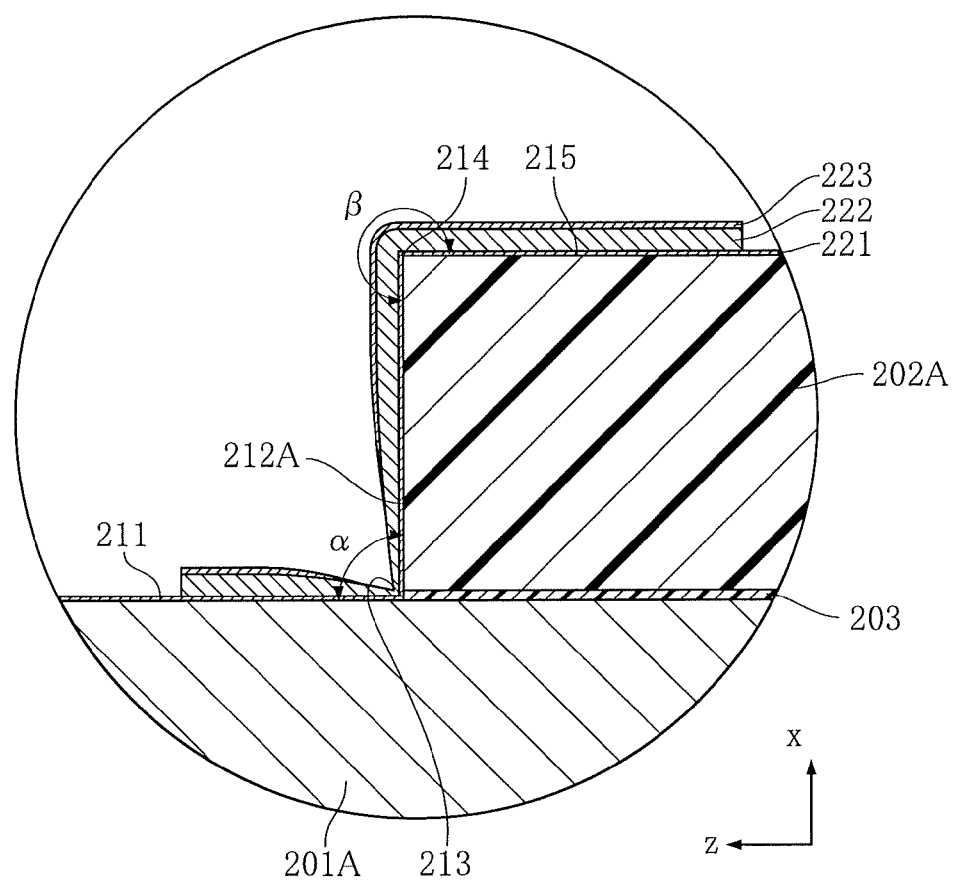
FIG. 19 is an enlarged cross-sectional view of main parts showing a step of making the direction sensor element for the semiconductor device of FIG. 1.
Figure 20:
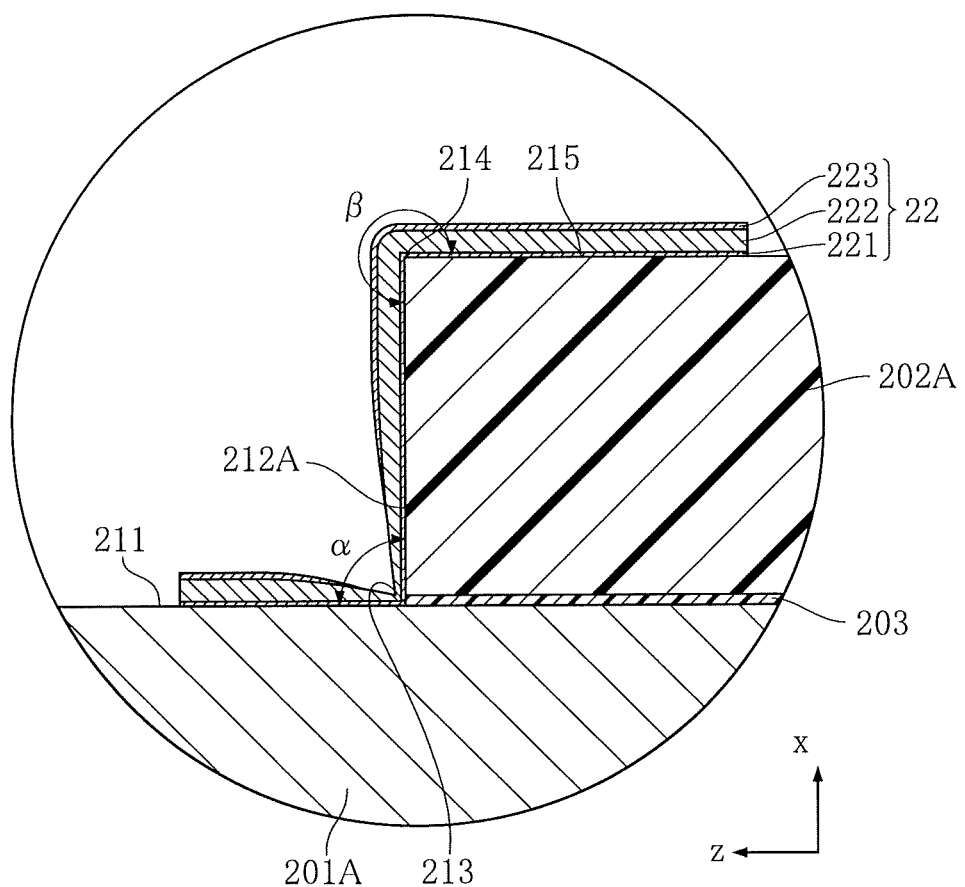
FIG. 20 is an enlarged cross-sectional view of main parts showing a step of making the direction sensor element for the semiconductor device of FIG. 1.

Next, as shown in FIG. 19, the mask layer 261 is removed. Also, a portion of the underlying plating layer 221 that is exposed from the main plating layer 222 and the top plating layer 223 is removed by etching or the like. By the above steps, obtained is the element pad 22 having a configuration in which the underlying plating layer 221, the main plating layer 222, and the top plating layer 223 are stack together.

The second direction sensor element 3 is bonded to an upper surface in the z-direction of the integrated circuit element 5 by a bonding member 33. The second direction sensor element 3 is mounted and oriented so that the magnetic material wire 31 is parallel to the y-direction. The second direction sensor element 3 is entirely covered by the integrated circuit element 5 as viewed in the z-direction. Four element pads 32 are formed on the second direction sensor element 3. The four element pads 32 are arranged in a row along the y-direction, facing upward along the z-direction. The element pad 32 has a surface formed of, for example, Au.

The third direction sensor element 4 is bonded to an upper surface in the z-direction in the figure of the integrated circuit element 5 by a bonding member 43. The third direction sensor element 4 is mounted and oriented so that the magnetic material wire 41 is parallel to the x-direction. The third direction sensor element 4 is entirely covered by the integrated circuit element 5 as viewed in the z-direction. Four element pads 42 are formed on the third direction sensor element 4. The four element pads 42 are arranged in a row along the x-direction, facing upward along the z-direction. The element pad 42 has a surface formed of, for example, Au.

The first wire 61 connects the element pad 22 of the first direction sensor element 2 and the element pad 52 of the integrated circuit element 5 together, and is formed of, for example, Au. As shown in FIG. 5, the first wire 61 has a first bonding portion 611 connected to the element pad 22 of the first direction sensor element 2. A position where the first wire 61 is bonded to the element pad 22 (in this example, a center position of the first bonding portion 611) is separated from the boundary 213 in the x-direction, and is located closer to the separate edge 214. The top plating layer 223 of the element pad 22 has a thickness of substantially zero in a region closer to the boundary 213, and therefore, a portion of the main plating layer 222 can be exposed. In this example, the first bonding portion 611 is bonded to a region where the top plating layer 223 is reliably formed.

Also, as shown in FIG. 4, the first wire 61 has a second bonding portion that is connected to the element pad 52 of the integrated circuit element 5 through a bump. The bump is formed by melting a tip end of a wire of Au and attaching the resultant melted ball to the element pad 52 prior to bonding of the first wire 61.

The second wire 62 connects the element pad 22 of the first direction sensor element 2 and the substrate pad 131 of the substrate 1 together, and is formed of, for example, Au. The first bonding portion of the second wire 62 is connected to the element pad 22 of the first direction sensor element 2. Also, the second bonding portion of the second wire 62 is connected to the substrate pad 131 of the substrate 1. A bump is not interposed between the second bonding portion of the second wire 62 and the substrate pad 131.

The third wire 63 connects the element pad 32 of the second direction sensor element 3 or the element pad 42 of the third direction sensor element 4, and the element pad 52 of the integrated circuit element 5, together, and is formed of, for example, Au. As shown in FIG. 6, the first bonding portion of the third wire 63 is connected to the element pad 52 of the integrated circuit element 5. Also, the second bonding portion of the third wire 63 is connected to the element pad 32 of the second direction sensor element 3 or the element pad 42 of the third direction sensor element 4 through a bump. The bump is formed by melting a tip end of a wire of Au and attaching the resultant melted ball to the element pad 32 or the element pad 42 prior to bonding of the third wire 63.

The fourth wire 64 connects the element pad 42 of the third direction sensor element 4 and the substrate pad 131 of the substrate 1 together, and is formed of, for example, Au. As shown in FIG. 4, the first bonding portion of the fourth wire 64 is connected to the substrate pad 131 of the substrate 1. Also, the second bonding portion of the fourth wire 64 is connected to the element pad 42 of the third direction sensor element 4 through a bump. The bump is formed by melting a tip end of a wire of Au and attaching the resultant melted ball to the element pad 42 prior to bonding of the fourth wire 64.

The fifth wire 65 connects the element pad 52 of the integrated circuit element 5 and the substrate pad 131 of the substrate 1 together, and is formed of, for example, Au. The first bonding portion of the fifth wire 65 is connected to the element pad 52 of the integrated circuit element 5. Also, the second bonding portion of the fifth wire 65 is connected to the substrate pad 131 of the substrate 1. A bump is not interposed between the second bonding portion of the fifth wire 65 and the substrate pad 131.

As shown in FIG. 2, the substrate pads 131 are formed on opposite portions in the y-direction of the main surface 111 between which the recessed portion 114 is interposed, and the second wires 62 or the fifth wires 65 are bonded to the substrate pads 131.

The sealing resin 7 covers the first direction sensor element 2, the second direction sensor element 3, the third direction sensor element 4, the integrated circuit element 5, the first wire 61, the second wire 62, the third wire 63, the fourth wire 64, and the fifth wire 65. Also, the recessed portion 114 is filled with a portion of the sealing resin 7. The sealing resin 7 may, for example, be epoxy resin, phenol resin, polyimide resin, polybenzoxazole (PBO) resin, or silicone resin.

The sealing resin 7 has sealing resin outer surfaces 71. The sealing resin outer surfaces 71 face in the x- and y-directions, and are parallel to the z-direction. Also, in this embodiment, the sealing resin outer surfaces 71 are flush with the substrate outer side surfaces 113 of the substrate 1.

Next, advantages of the semiconductor device 101A will be described.

According to this embodiment, as shown in FIG. 5, the first bonding portion 611 of the first wire 61 is provided at a position close to the separate edge 214 that is located on an opposite side from the boundary 213. In the process of making the element pad 22 described with reference to FIGS. 15 to 20, the element pad 22 may have a non-uniform thickness due to the plating solution held. As a result, the element pad 22 has a portion that becomes thinner toward the boundary 213. The first bonding portion 611 is provided at the above position, and therefore, it is possible to avoid bonding the first wire 61 to a portion of the element pad 22 that has an excessively small thickness. Therefore, the first wire 61 and the element pad 22 can be more firmly bonded together, and therefore, the first direction sensor element 2 and the substrate 1 can be electrically connected together more reliably.

The first main portion 201A and the second main portion 202A are separate portions, and therefore, the bonding surface 212A formed of an insulating material facing upward along the z-direction can be appropriately configured with the magnetic material wire 21 included in the first main portion 201A being in an upright position along the z-direction. The bonding surface 212A is located at a retreat position that is slightly lower than an upper end in the z-direction of the first main portion 201A, and therefore, it is possible to prevent the semiconductor device 101A from having an excessively large dimension in the z-direction due to bonding of the first wire 61.

In the case where the element pad 22 has a configuration in which the underlying plating layer 221, the main plating layer 222, and the top plating layer 223 are stacked together, the main plating layer 222 can be exposed from the top plating layer 223 in the vicinity of the boundary 213. The first bonding portion 611 is provided closer to the separate edge 214 in a region where the top plating layer 223 can be reliably formed, and therefore, the first wire 61 and the element pad 22 can be more reliably bonded together.

Also, the first direction sensor element 2 is provided at a position that allows a portion of the first direction sensor element 2 to coincide with the recessed portion 114 in the z-direction. As a result, a dimension of the first direction sensor element 2 that protrudes from the main surface 111 of the substrate 1 upward along the z-direction can be reduced. Therefore, the size of the semiconductor device 101A can be reduced.

In particular, the magnetic material wire 21 of the first direction sensor element 2 is parallel to the z-direction. The first direction sensor element 2 having such a configuration typically has a large dimension in the z-direction. Reducing the dimension in the z-direction of the first direction sensor element 2 that protrudes from the main surface 111 as a result of a portion of the first direction sensor element 2 being accommodated in the blocking portion 141 is advantageous for the size reduction of the semiconductor device 101A.

The magnetic material wire 31 of the second direction sensor element 3 is parallel to the y-direction, and the magnetic material wire 41 of the third direction sensor element 4 is parallel to the x-direction. Therefore, the second direction sensor element 3 and the third direction sensor element 4 have a relatively small dimension in the z-direction. It is reasonable to arrange the second direction sensor element 3 and the third direction sensor element 4 having such a configuration at a position that allows them to coincide with the main surface ill, because the dimension in the z-direction of the semiconductor device 101A does not increase.

Moreover, the second direction sensor element 3 and the third direction sensor element 4 are mounted on the integrated circuit element 5, and therefore, the dimensions in the x- and y-directions of the semiconductor device 101A can be reduced without an increase in the dimension in the z-direction of the semiconductor device 101A.

The blocking portion 141 is provided in the interconnect pattern 12, and therefore, the blocking portion 141 can be readily formed using the laser light L as described above with reference to FIG. 14. Also, the removal action of the laser light L is reliably blocked by the blocking portion 141, and therefore, the blocking portion 141 having a desired depth can be formed. The blocking portion 141 is larger than the bottom surface 115, and therefore, the laser light L can be prevented from accidentally reaching the back surface 112, even when the laser light L has variations in its irradiation accuracy, for example.

Figure 10:
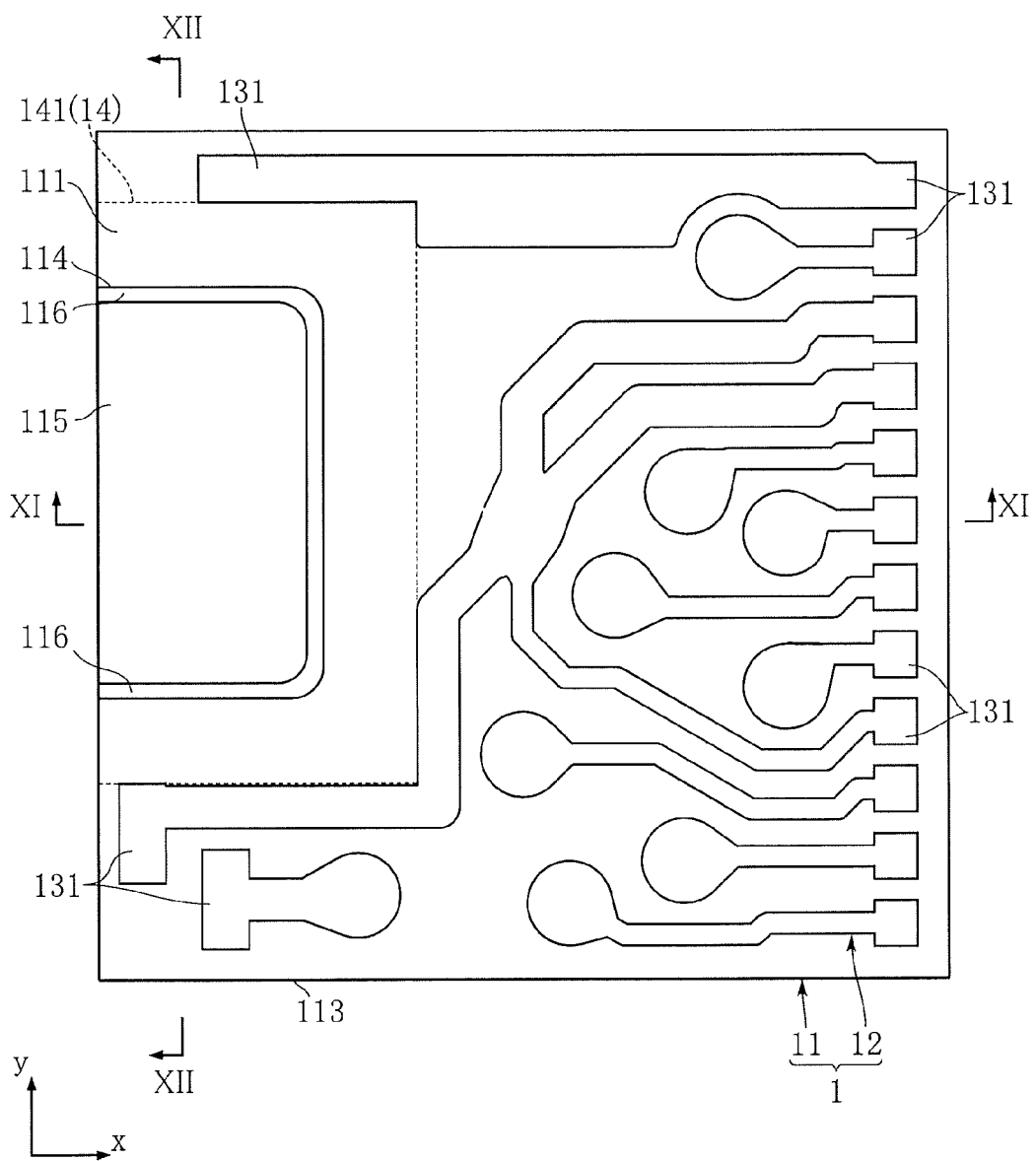
FIG. 10 is a plan view showing the substrate of FIG. 9.
Figure 11:
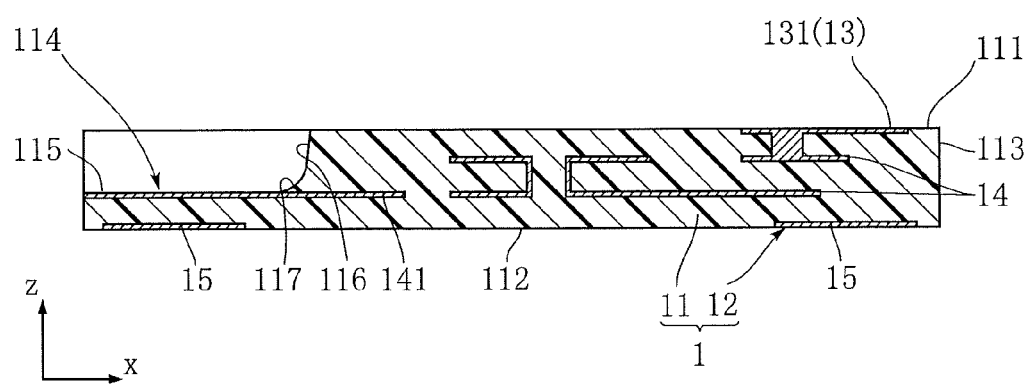
FIG. 11 is a cross-sectional view taken along line XI-XI of FIG. 10.
Figure 12:
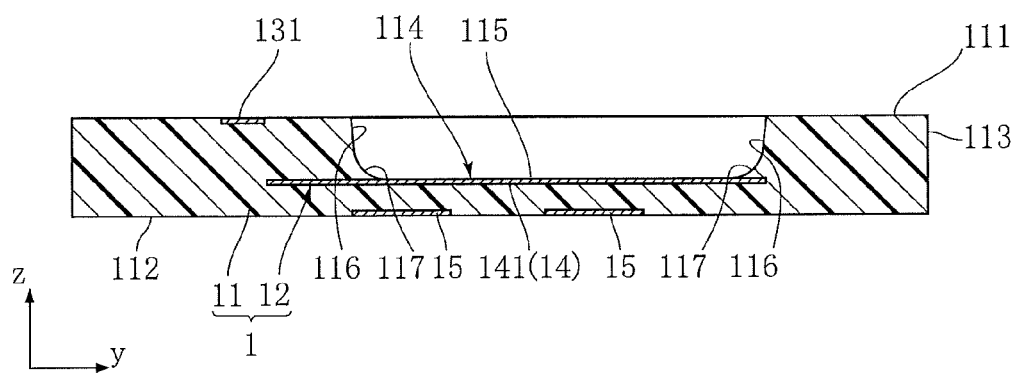
FIG. 12 is a cross-sectional view taken along line XII-XII of FIG. 10.

As shown in FIG. 10, in the substrate 1, the main surface 111 is provided on opposite sides in the y-direction of the recessed portion 114. The portion where the main surface 111 is provided has a larger thickness in the z-direction than that of the recessed portion 114. Such a configuration provides an appropriate stiffness of the substrate 1 even though the recessed portion 114 is formed. As a result, the substrate 1 can be prevented from unduly bending during making of the semiconductor device 101A.

The blocking portion 141 and the two back surface electrodes 15 are caused to coincide with each other, and therefore, the back surface electrodes 15 can be arranged on the back surface 112 at well-balanced positions without being unbalanced.

The second bonding portion of the first wire 61 is connected to the element pad 52 of the integrated circuit element 5 through a bump, and therefore, an unduly large force can be prevented from being applied to the integrated circuit element 5 during the bonding step of the second bonding portion to which a relatively large force is applied.

The second bonding portion of the third wire 63 is connected to the element pad 32 of the second direction sensor element 3 or the element pad 42 of the third direction sensor element 4 through a bump, and therefore, an unduly large force can be prevented from being applied to the second direction sensor element 3 or the third direction sensor element 4 during the bonding step of the second bonding portion of the third wire 63. Also, the second bonding portion is provided on the second direction sensor element 3 or the third direction sensor element 4, and therefore, a height in the z-direction of the semiconductor device 101A can be avoided from being excessively large.

FIGS. 21 to 40 show variations and other embodiments of the present invention. Note that, in these figures, the same or similar parts as or to those of the above embodiments are indicated by the same reference characters as those of the above embodiments.

Figure 21:
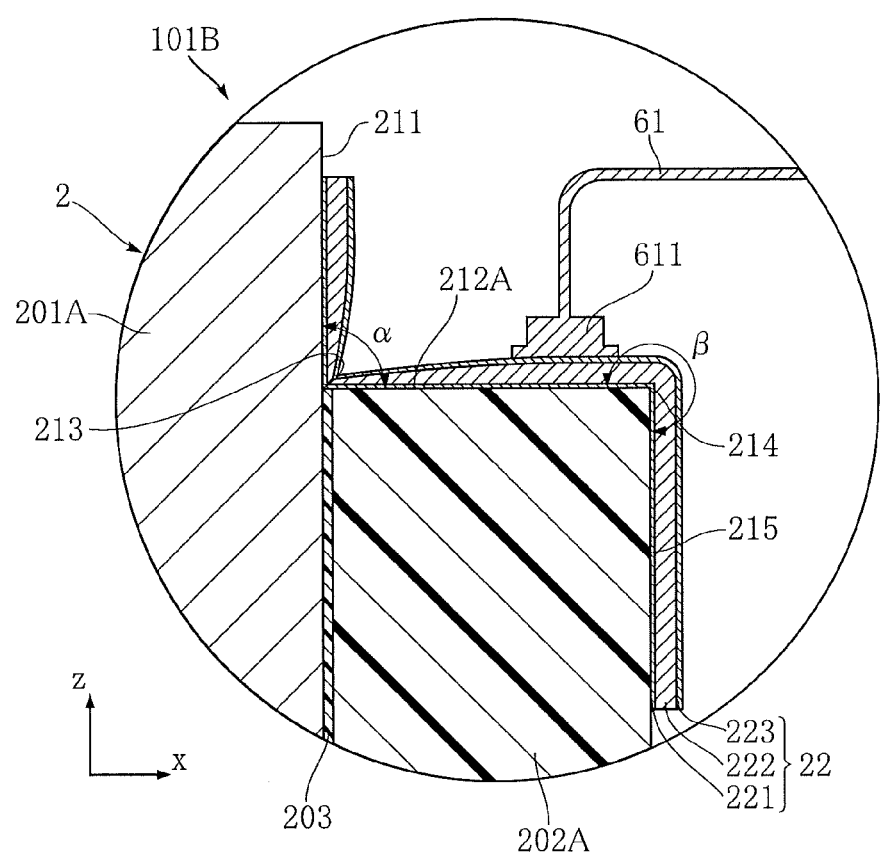
FIG. 21 is an enlarged cross-sectional view of main parts showing a variation of the semiconductor device of FIG. 1.

FIG. 21 shows a variation of the semiconductor device based on the first embodiment of the present invention. The semiconductor device 101B of this variation is different from the above semiconductor device 101A in the configuration of the element pad 22. In this example, the top plating layer 223 covers almost all the main plating layer 222. More specifically, in the vicinity of the boundary 213, the main plating layer 222 is also covered by the top plating layer 223, and is not exposed from the top plating layer 223.

Also, in such a variation, the first wire 61 and the element pad 22 can be more firmly bonded together, and the first direction sensor element 2 and the substrate 1 can be electrically connected together more reliably.

Figure 22:
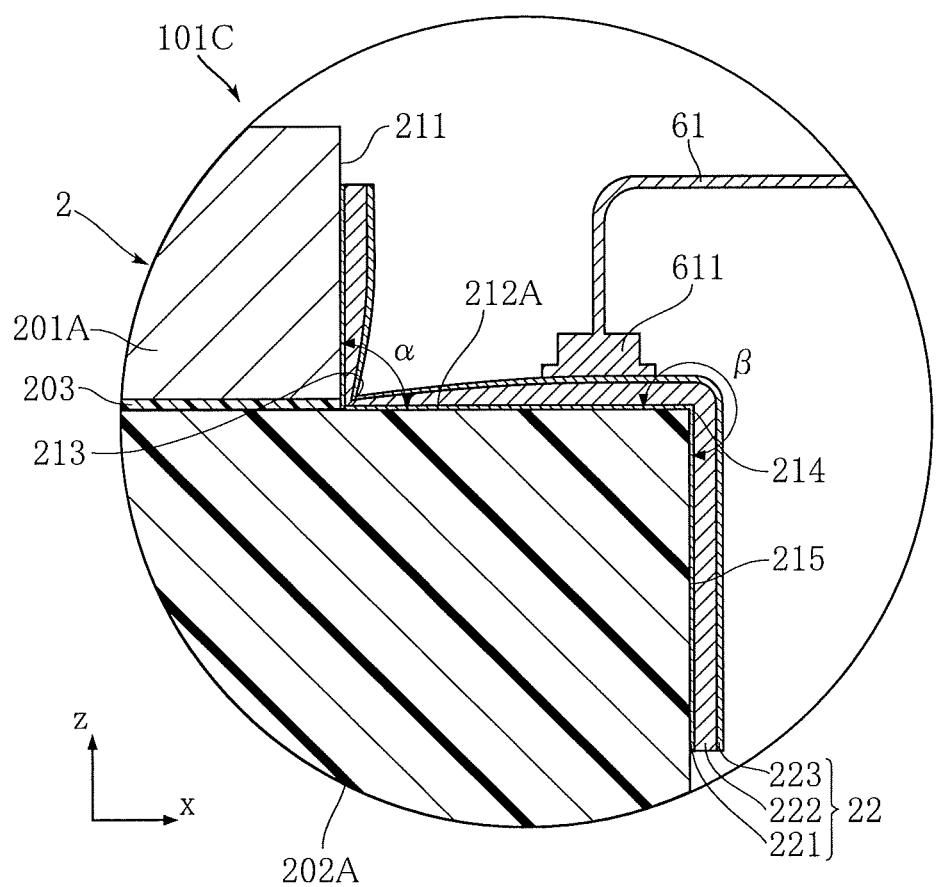
FIG. 22 is an enlarged cross-sectional view of main parts showing another variation of the semiconductor device of FIG. 1.

FIG. 22 shows another variation of the semiconductor device based on the first embodiment of the present invention. The semiconductor device 101C of this variation is different from the above examples in the configuration of the first main portion 201A and the second main portion 202A. More specifically, a position where the first main portion 201A and the second main portion 202A are bonded together is different from those of the semiconductor device 101A and the semiconductor device 101B described above. The second main portion 202A has a surface continuous with the bonding surface 212A, and the first main portion 201A is bonded to that surface by the bonding member 203.

Also, in such a variation, the first wire 61 and the element pad 22 can be more firmly bonded together, and the first direction sensor element 2 and the substrate 1 can be electrically connected together more reliably.

Figure 23:
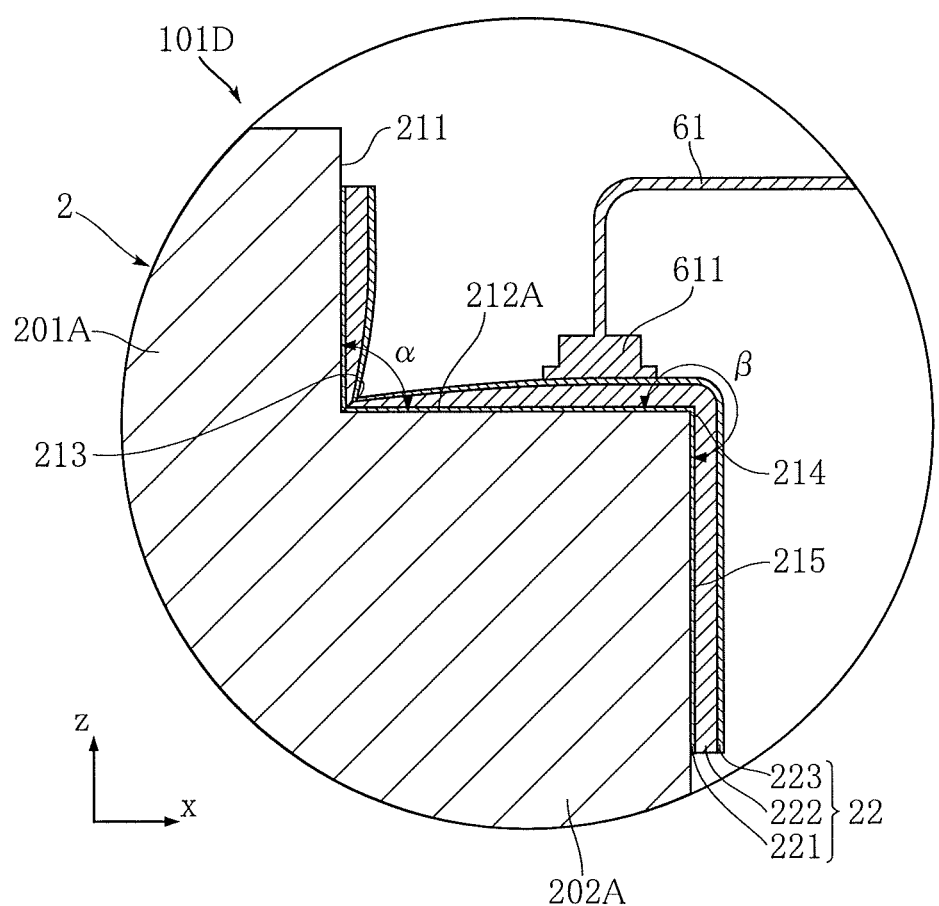
FIG. 23 is an enlarged cross-sectional view of main parts showing another variation of the semiconductor device of FIG. 1.

FIG. 23 shows another variation of the semiconductor device based on the first embodiment of the present invention. The semiconductor device 102D of this variation is different from the above examples in the configuration of the first direction sensor element 2. In this variation, the first main portion 201A and the second main portion 202A are integrally formed. More specifically, the first main portion 201A and the second main portion 202A are formed by a semiconductor that is shaped to have the reference surface 211, the bonding surface 212A, and the retreat side surface 215.

Also, in such a variation, the first wire 61 and the element pad 22 can be more firmly bonded together, and the first direction sensor element 2 and the substrate 1 can be electrically connected together more reliably.

Figure 24:
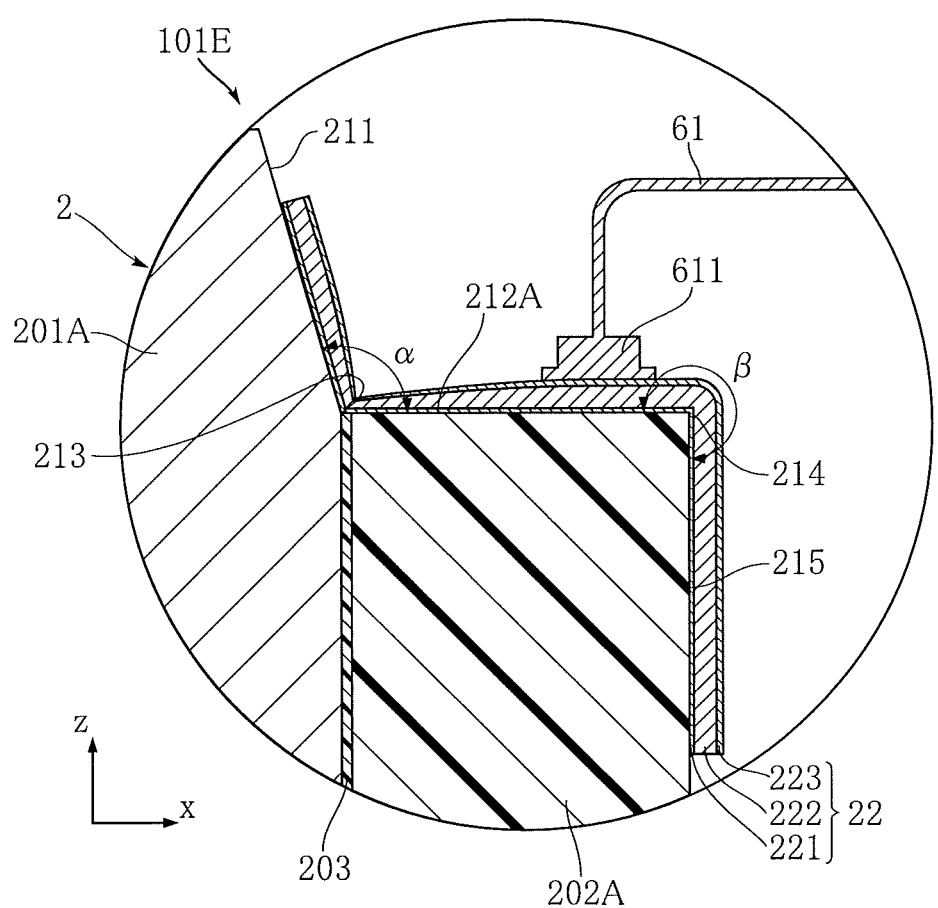
FIG. 24 is an enlarged cross-sectional view of main parts showing another variation of the semiconductor device of FIG. 1.

FIG. 24 shows another variation of the semiconductor device based on the first embodiment of the present invention. The semiconductor device 101E of this variation is different from the above examples in the value of the angle α between the reference surface 211 and the bonding surface 212A. In this variation, the angle α is more than 90°. Note that the angle α is set to be less than 180° as described above.

Also, in such a variation, the first wire 61 and the element pad 22 can be more firmly bonded together, and the first direction sensor element 2 and the substrate 1 can be electrically connected together more reliably. Also, in the above semiconductor devices 101B to 101D, the angle α can, of course, be set to various values.

Figure 25:
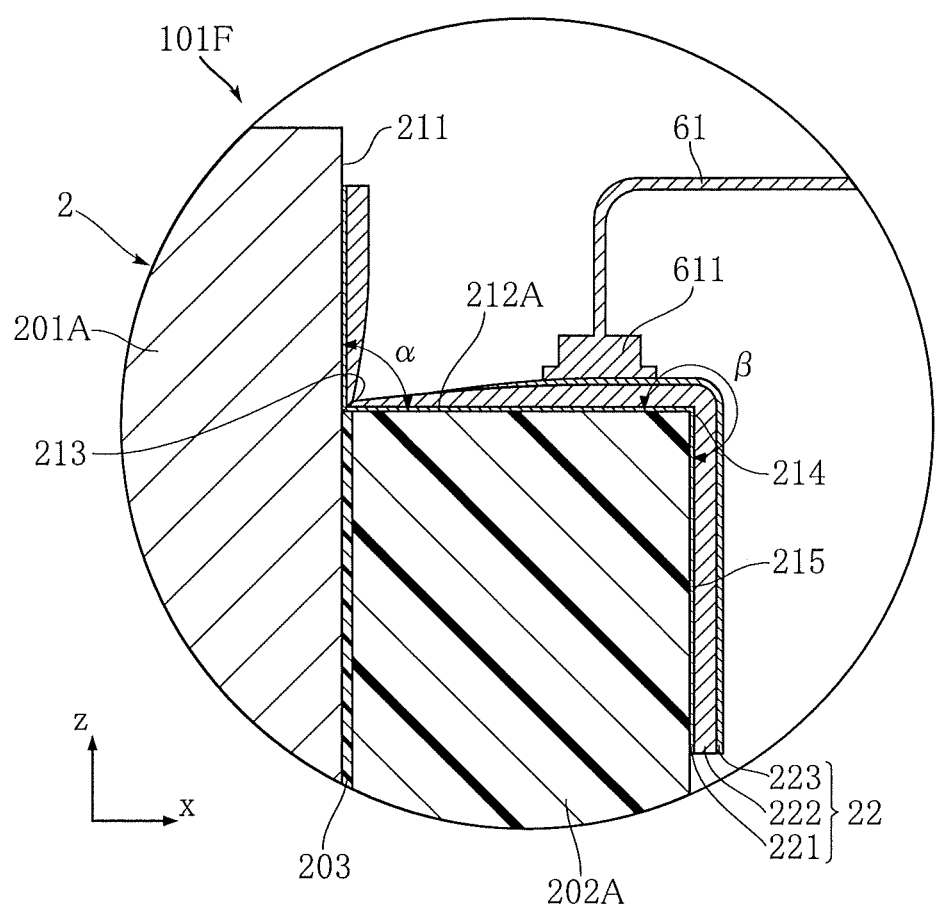
FIG. 25 is an enlarged cross-sectional view of main parts showing another variation of the semiconductor device of FIG. 1.

FIG. 25 shows another variation of the semiconductor device based on the first embodiment of the present invention. In the semiconductor device 101F of this variation, the top plating layer 223 is provided in a region that covers the bonding surface 212A and the retreat side surface 215, but not in a region that covers the reference surface 211.

Also, in such a variation, the first wire 61 and the element pad 22 can be more firmly bonded together, and the first direction sensor element 2 and the substrate 1 can be electrically connected together more reliably. Also, in the above semiconductor devices 101B to 101E, the top plating layer 223 can, of course, have a configuration similar to that of this variation.

Figure 26:
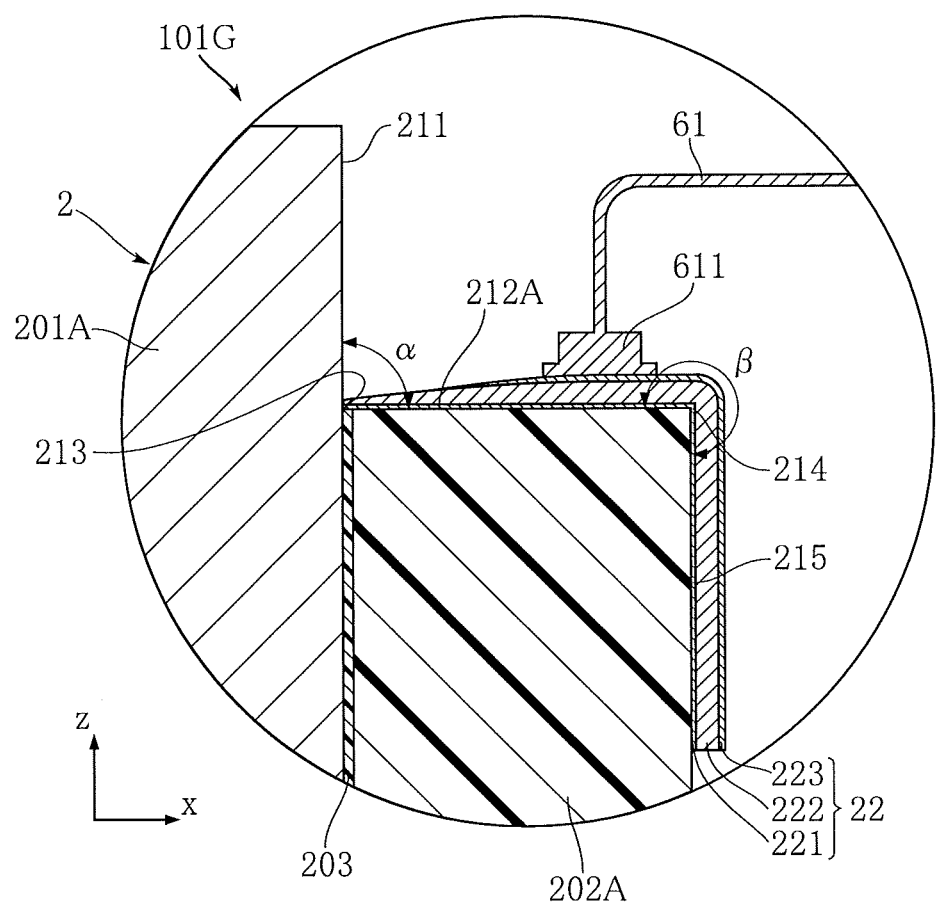
FIG. 26 is an enlarged cross-sectional view of main parts showing another variation of the semiconductor device of FIG. 1.

FIG. 26 shows another variation of the semiconductor device based on the first embodiment of the present invention. In the semiconductor device 101G of this variation, the element pad 22 is provided in a region that covers the bonding surface 212A and the retreat side surface 215, but not in a region that covers the reference surface 211.

Also, in such a variation, the first wire 61 and the element pad 22 can be more firmly bonded together, and the first direction sensor element 2 and the substrate 1 can be electrically connected together more reliably. Also, in the above semiconductor devices 101B to 101F, the element pad 22 can, of course, have a configuration similar to that of this variation.

Figure 27:
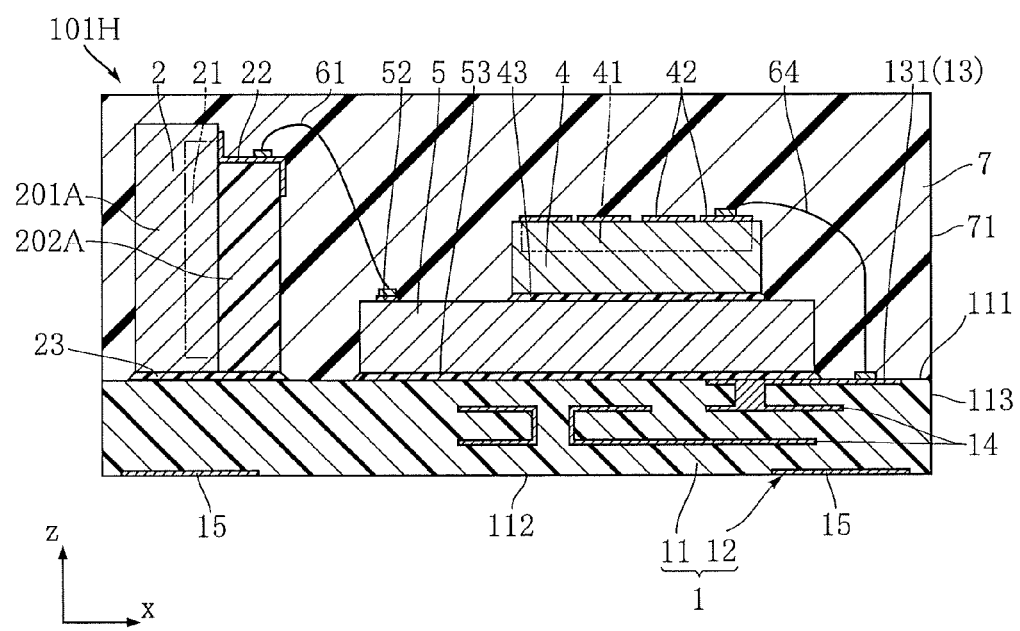
FIG. 27 is a cross-sectional view showing another variation of the semiconductor device of FIG. 1.

FIG. 27 shows another variation of the semiconductor device based on the first embodiment of the present invention. In the semiconductor device 101H of this variation, the above recessed portion 114 is not formed in the substrate 1. In this variation, the first direction sensor element 2 is mounted on the main surface ill of the substrate 1.

Also, in such a variation, the first wire 61 and the element pad 22 can be more firmly bonded together, and the first direction sensor element 2 and the substrate 1 can be electrically connected together more reliably. Also, in the above semiconductor devices 101B to 101G, the substrate 1 and the first direction sensor element 2 can, of course, have a configuration similar to that of this variation.

Figure 28:
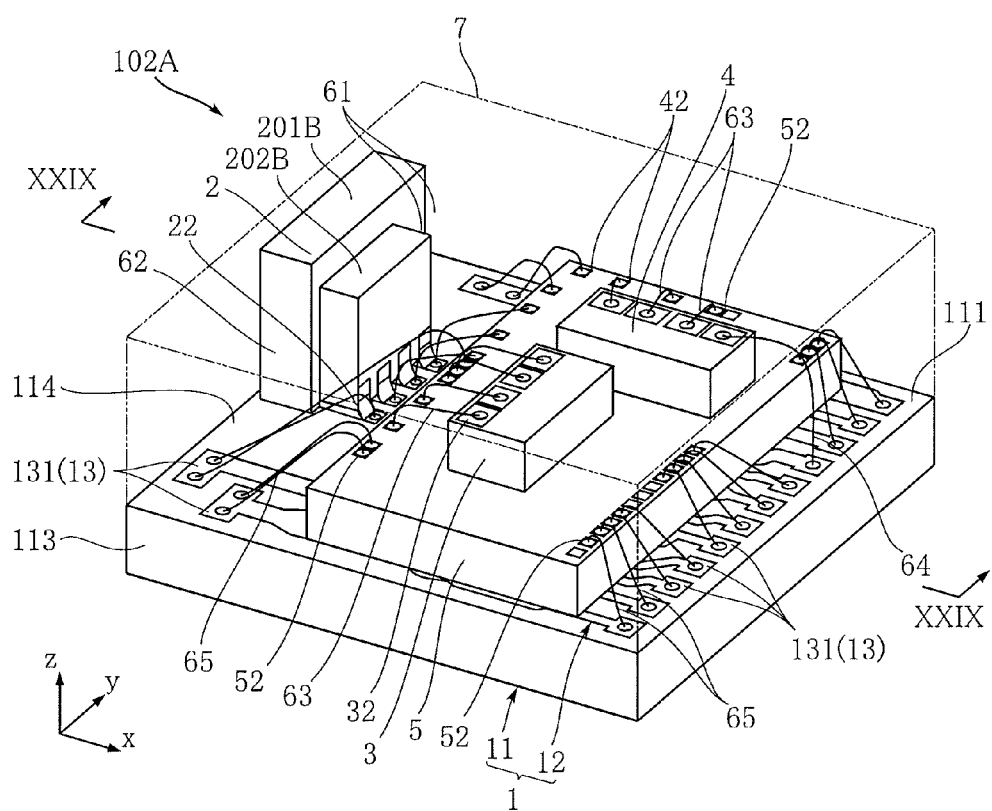
FIG. 28 is a perspective view of a semiconductor device based on a second embodiment of the present invention.
Figure 29:
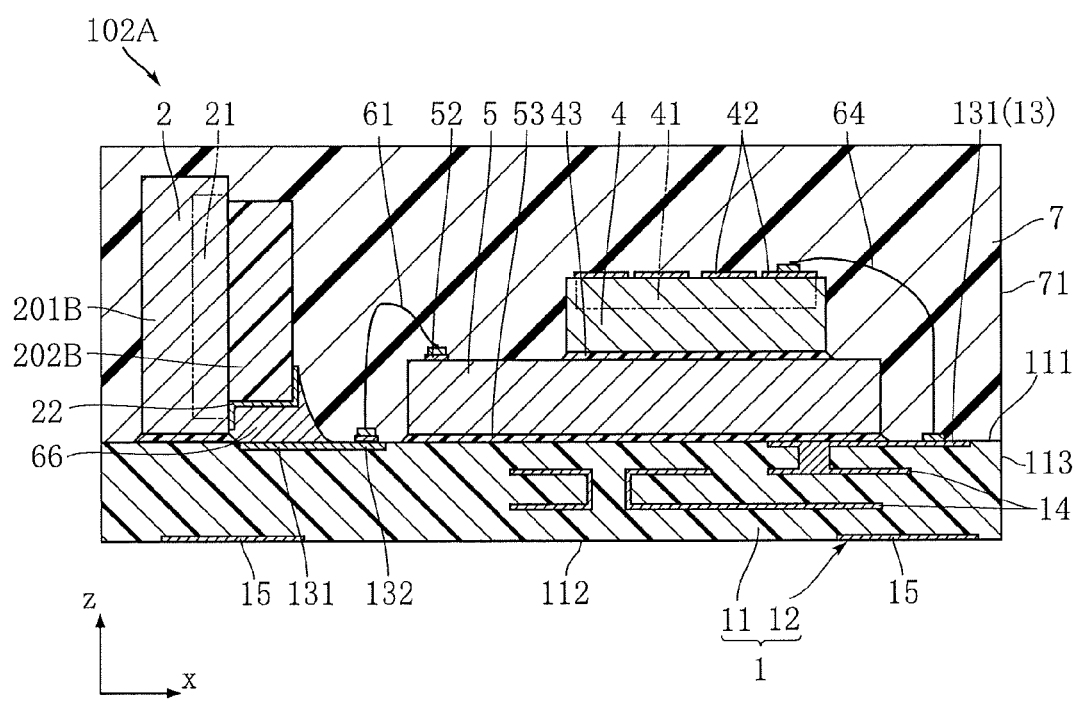
FIG. 29 is a cross-sectional view taken along line XXIX-XXIX of FIG. 28.

FIGS. 28 and 29 show a semiconductor device based on the second embodiment of the present invention. The semiconductor device 102A of this embodiment is different from the above semiconductor device of the first embodiment in the configuration of the substrate 1 and the first direction sensor element 2 and the mounted form of the first direction sensor element 2 on the substrate 1. Note that parts other than those described below are similar to those of the semiconductor device of the first embodiment.

Figure 30:
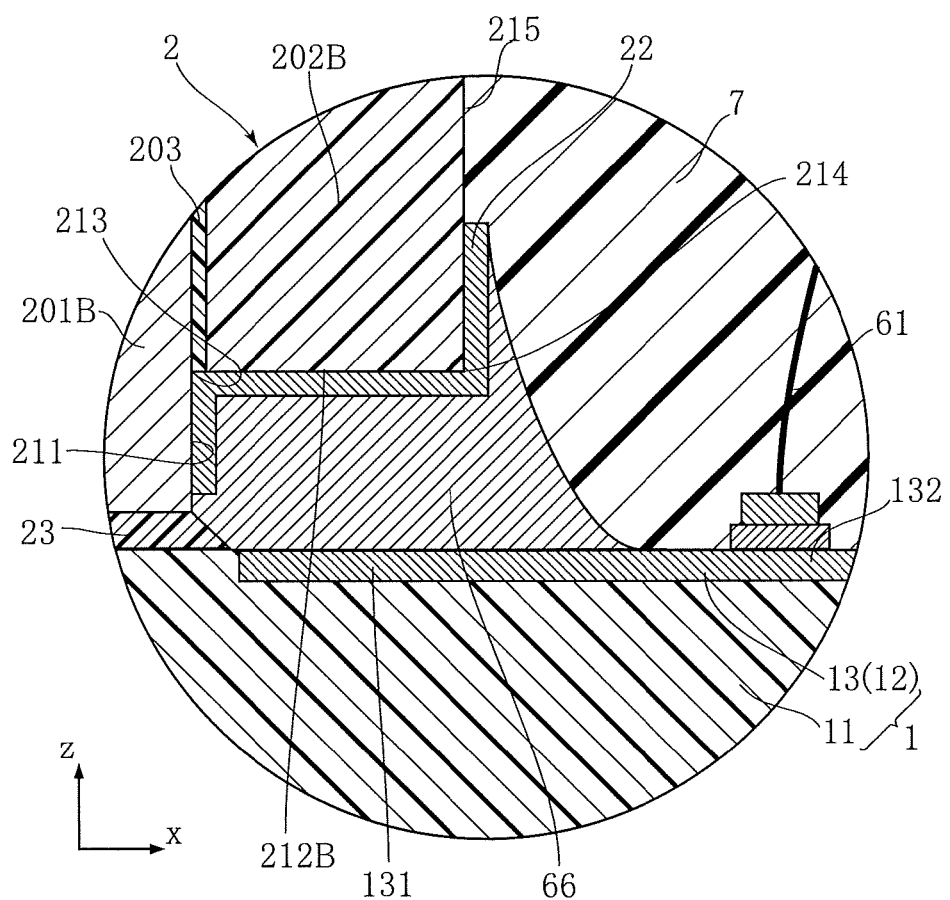
FIG. 30 is an enlarged cross-sectional view of main parts showing the semiconductor device of FIG. 28.

FIG. 28 is a perspective view showing the semiconductor device 102A. FIG. 29 is a cross-sectional view taken along line XXIX-XXIX of FIG. 28. FIG. 30 is an enlarged cross-sectional view of main parts.

In this embodiment, the first direction sensor element 2 has a semiconductor portion 201B and an auxiliary portion 202B. These names are used for ease of understanding of the invention in this embodiment. When some configurations, such as materials or the like, are used, the semiconductor portion 201B and the auxiliary portion 202B may be the same or similar members as or to the above first main portion 201A and second main portion 202A.

In this example, the recessed portion 114 described in connection with the semiconductor device 101A is not formed in the substrate 1. In this example, the first direction sensor element 2 is mounted on the main surface 111 of the substrate 1.

In this embodiment, the semiconductor portion 201B is formed of, for example, a semiconductor, such as Si or the like, and includes a magnetic material wire 21. The auxiliary portion 202B is formed of, for example, an insulating material, such as a resin or the like. The semiconductor portion 201B and the auxiliary portion 202B are separate portions, and are bonded together by a bonding member 203.

As shown in FIG. 30, the first direction sensor element 2 has a reference surface 211, a pad surface 212B, and a retreat side surface 215. The reference surface 211 is parallel to the yz plane and faces rightward along the x-direction in FIG. 30. The reference surface 211 is formed by the semiconductor portion 201B. The pad surface 212B is parallel to the xy plane and faces downward along the z-direction in FIG. 30. The pad surface 212B is formed by the auxiliary portion 202B. A boundary 213 is set between the reference surface 211 and the pad surface 212B. The boundary 213 substantially separates the reference surface 211 from the pad surface 212B, and is not limited to one that is formed only by the reference surface 211 and the pad surface 212B. For example, in the example shown, the boundary 213 is formed by the bonding member 203.

A separate edge 214 is set on an opposite side of the pad surface 212B from the boundary 213. The separate edge 214 is an edge separate from the boundary 213. The retreat side surface 215 extends from the separate edge 214 in a direction opposite to a direction in which the bonding surface 212A faces, i.e., upward along the z-direction in FIG. 30.

As shown in FIG. 30, the element pad 22 has a portion that is formed on the pad surface 212B. Moreover, in this example, the element pad 22 is formed in a region extending from the boundary 213 to the separate edge 214 in the x-direction. Also, the element pad 22 has a portion formed on the reference surface 211. The portion of the element pad 22 that is formed on the reference surface 211 extends from the boundary 213 downward along the z-direction. As a result, the boundary 213 is covered by the element pad 22. In this example, the element pad 22 does not reach a lower end in the z-direction of the semiconductor portion 201B. Also, the element pad 22 has a portion that is formed on the retreat side surface 215. The portion of the element pad 22 that is formed on the retreat side surface 215 extends from the separate edge 214 upward along the z-direction. As a result, the separate edge 214 is covered by the element pad 22.

In this example, the element pad 22 has a configuration in which an underlying plating layer 221, a main plating layer 222, and a top plating layer 223, described above, are stacked together. Note that the element pad 22 is not limited to this configuration, and may have any configuration that electrically connects and bond it to the substrate 1.

In this example, a substrate pad 131 is provided immediately below the element pad 22 of the first direction sensor element 2 in the z-direction. In other words, the pad surface 212B faces the substrate pad 131 of the substrate 1.

The semiconductor portion 201B of the first direction sensor element 2 is bonded to the main surface 111 of the substrate 1 by a bonding member 23. Also, the element pad 22 is electrically connected and bonded to the substrate pad 131 of the substrate 1 by a conductive bonding member 66. The conductive bonding member 66 may be any one that can electrically and mechanically connect the first direction sensor element 2 to the substrate 1, and may be formed of, for example, solder, metal paste, or the like.

A space between a portion of the element pad 22 that is formed on the pad surface 212B and the substrate pad 131 is substantially entirely filled with the conductive bonding member 66. Also, when the conductive bonding member 66 is formed of, for example, solder, the conductive bonding member 66 is melted into liquid during the bonding step. At this time, the melted conductive bonding member 66 adheres to a portion of the element pad 22 that is formed on the retreat side surface 215. As a result, as shown in FIGS. 28 to 30, the conductive bonding member 66 is in an upright position along the portion of the element pad 22 that is formed on the retreat side surface 215, i.e., the finished conductive bonding member 66 has a shape having a so-called fillet portion. Also, the conductive bonding member 66 may also adhere to a portion of the element pad 22 that is formed on the reference surface 211.

As shown in FIGS. 29 and 30, the main surface layer 13 has an additional substrate pad 132. The additional substrate pad 132 is electrically connected to the substrate pad 131. When the substrate pads 131 are formed on the main surface layer 13, the same number of additional substrate pads 132 as there are the substrate pads 131 can be provided. One end of the first wire 61 is bonded to the additional substrate pad 132. The other end of the first wire 61 is bonded to the element pad 52 of the integrated circuit element 5.

Next, advantages of the semiconductor device 102A will be described.

According to such an embodiment, it is not necessary to perform wire bonding in order to electrically connect and bond the first direction sensor element 2 and the substrate 1 together.

In the first direction sensor element 2, the semiconductor portion 201B is typically in an upright position along the z-direction in order to cause the magnetic material wire 21 to be in an upright position along the z-direction. When the element pad 22 is provided in order to electrically connect such a semiconductor portion 201B, the element pad 22 is formed on the auxiliary portion 202B or the like as a base. When the element pad 22 is formed of a resin or the like, vibration or pressing force is dispersed during wire bonding, which interferes with firm bonding. Also, when a great force is applied to the first direction sensor element 2 that is in an upright position along the z-direction due to bonding, the first direction sensor element 2 is likely to be unstable. In this regard, in the semiconductor device 102A in which electrical connection and bonding are established by the conductive bonding member 66, a factor in causing wire bonding to be unstable can be removed, and the substrate 1 and the first direction sensor element 2 can be electrically connected together more reliably and firmly.

The element pad 22 is configured to have a portion that is formed on the retreat side surface 215, and therefore, a fillet portion can be provided to the conductive bonding member 66. The fillet portion is advantageous in electrically connecting the first direction sensor element 2 to the substrate 1 more firmly. Also, the success or failure of mounting the first direction sensor element 2 can be easily determined by visually checking the presence or absence of the fillet portion.

The element pad 22 has a portion that is formed on the reference surface 211, and therefore, the bonding strength of the first direction sensor element 2 can be further improved.

The auxiliary portion 202B is configured as a member formed of an insulating material, that is separate from the semiconductor portion 201B, and therefore, it is possible to avoid unintended electrical connection in the first direction sensor element 2. Also, a relatively complicated shape having the reference surface 211, the pad surface 212B, and the retreat side surface 215 can be appropriately formed by combining the semiconductor portion 201B and the auxiliary portion 202B together.

Figure 31:
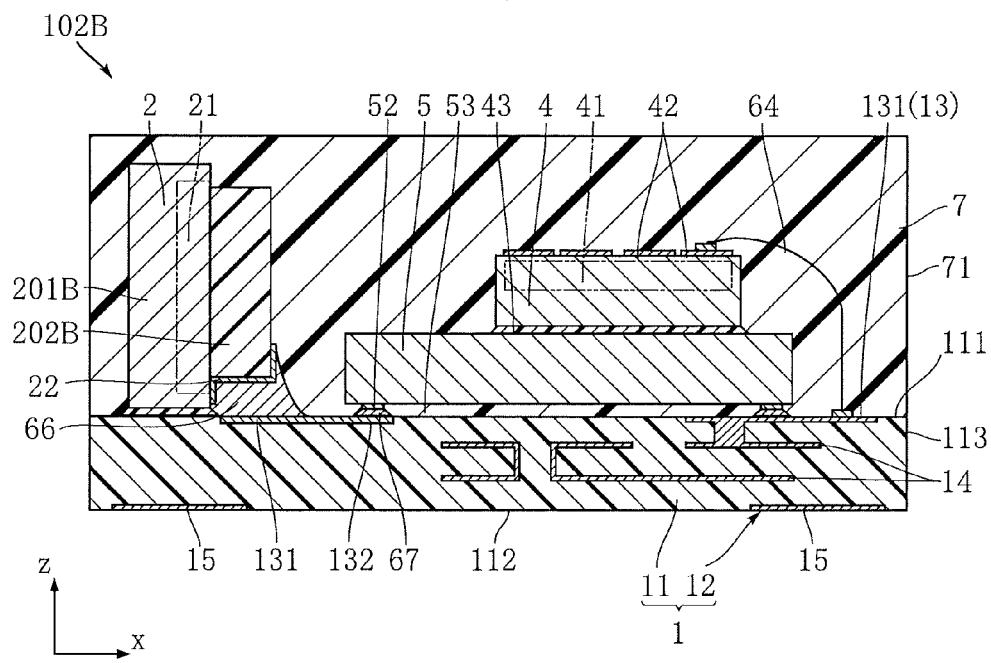
FIG. 31 is a cross-sectional view showing a variation of the semiconductor device of FIG. 28.

FIG. 31 shows a variation of the semiconductor device based on the second embodiment of the present invention. In the semiconductor device 102B of this variation, the element pad 52 of the integrated circuit element 5 is provided, facing downward along the z-direction in FIG. 31. In addition, the element pad 52 and the additional substrate pad 132 of the substrate 1 are bonded together by a conductive bonding member 67. The conductive bonding member 67 is, for example, solder.

Also, in such a variation, the substrate 1 and the first direction sensor element 2 can be electrically connected together more reliably and f firmly, and the first direction sensor element 2 and the integrated circuit element 5 can be electrically connected together appropriately.

Figure 32:
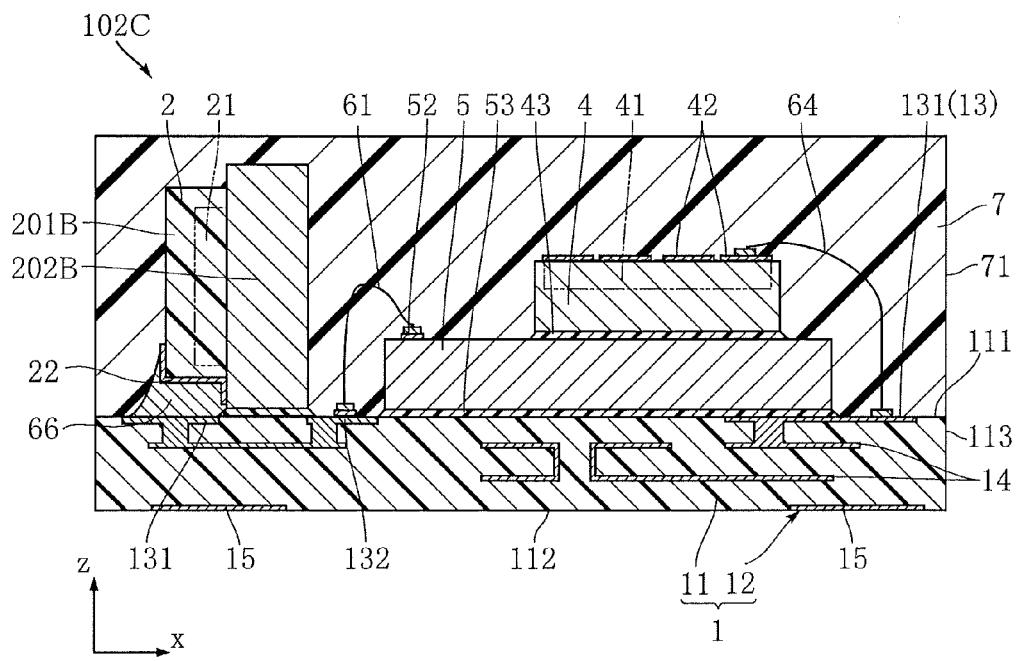
FIG. 32 is a cross-sectional view showing a variation of the semiconductor device of FIG. 28.

FIG. 32 shows another variation of the semiconductor device based on the second embodiment of the present invention. The semiconductor device 102C of this variation is different from the above first main portion 201A and semiconductor device 102B in a position in the x-direction of the auxiliary portion 202B. In this variation, the auxiliary portion 202B is provided on an opposite side of the semiconductor portion 201B from the integrated circuit element 5.

Because of the arrangement of the auxiliary portion 202B, the substrate pad 131 of the substrate 1 is located farther away from the integrated circuit element 5 than is the semiconductor portion 201B. The substrate pad 131 and the additional substrate pad 132 are electrically connected together by a portion of the middle layer 14.

Also, in such a variation, the substrate 1 and the first direction sensor element 2 can be electrically connected together more reliably and firmly, and the first direction sensor element 2 and the integrated circuit element 5 can be electrically connected together appropriately.

Figure 33:
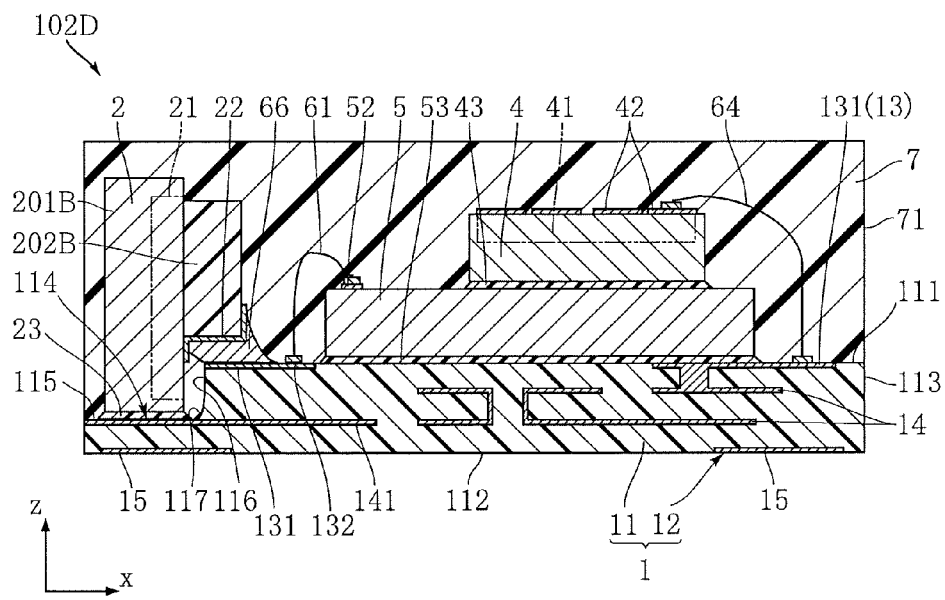
FIG. 33 is a cross-sectional view showing a variation of the semiconductor device of FIG. 28.

FIG. 33 shows another variation of the semiconductor device based on the second embodiment of the present invention. The semiconductor device 102D of this variation is different from the above example in the configuration of the substrate 1 and the connection form of the first direction sensor element 2. In this variation, the recessed portion 114 is formed in the substrate 1. The substrate 1 having the recessed portion 114 has a configuration similar to that described above in connection with the semiconductor device 101A.

The substrate pad 131 is provided on the main surface 111. On the other hand, the semiconductor portion 201B of the first direction sensor element 2 has a portion that is accommodated in the recessed portion 114. The semiconductor portion 201B is bonded to the bottom surface 115 of the recessed portion 114 by the bonding member 23. The element pad 22 is bonded to the substrate pad 131 that is located at an upper position in the z-direction in the figure than the position of the bottom surface 115, and therefore, in this variation, there is a relatively great distance between a lower end in the z-direction in the figure of the semiconductor portion 201B and the pad surface 212B.

Also, in such a variation, the substrate 1 and the first direction sensor element 2 can be electrically connected together more reliably and firmly, and the first direction sensor element 2 and the integrated circuit element 5 can be electrically connected together appropriately. Also, the semiconductor device 102D can have a reduced dimension in the z-direction.

Figure 34:
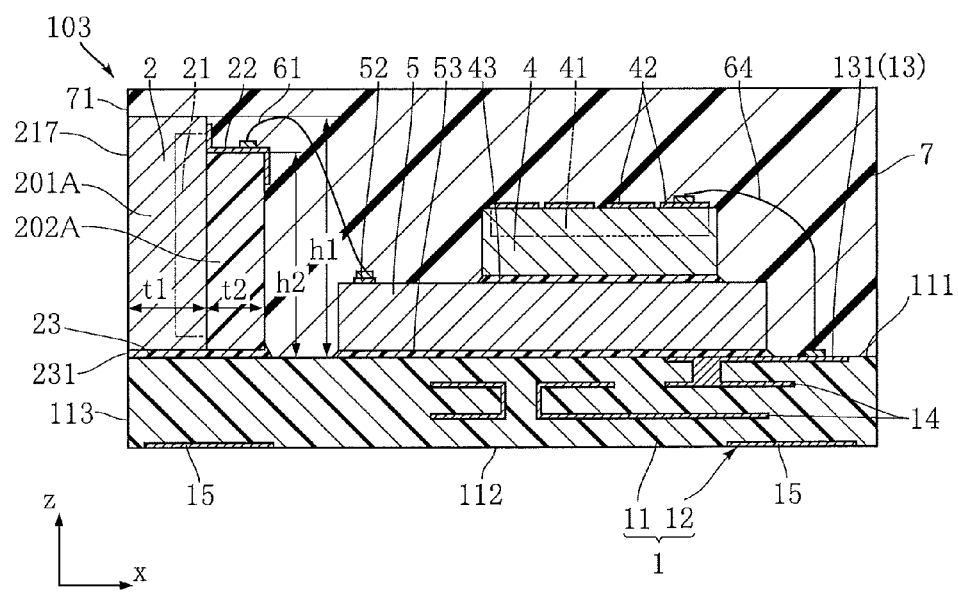
FIG. 34 is a cross-sectional view of a semiconductor device based on a third embodiment of the present invention.
Figure 35:
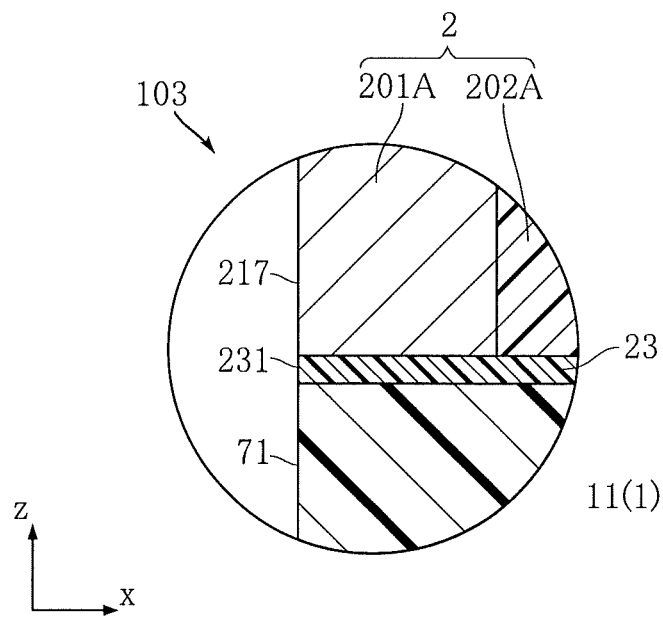
FIG. 35 is an enlarged cross-sectional view of main parts showing the semiconductor device of FIG. 34.
Figure 36:
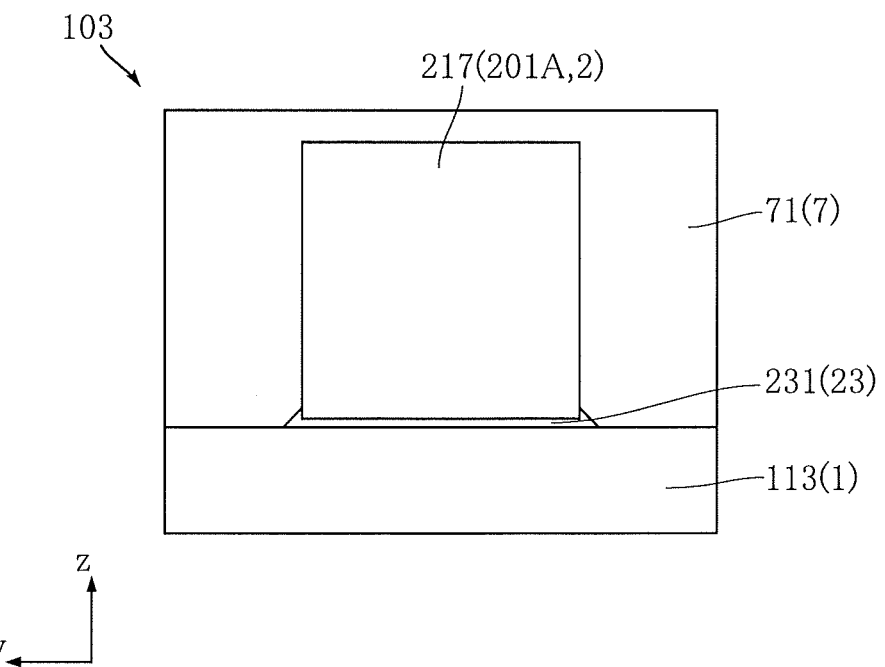
FIG. 36 is a side view showing the semiconductor device of FIG. 34.

FIGS. 34 to 36 show a semiconductor device based on the third embodiment of the present invention. The semiconductor device 103 of this embodiment is different from those of the above first and second embodiments mainly in the mounted form of the first direction sensor element 2. Note that parts other than those described below are similar to those of the semiconductor devices of the first and second embodiments, and may be appropriately combined together.

FIG. 34 is a cross-sectional view showing the semiconductor device 103 taken along the zx plane. FIG. 35 is an enlarged cross-sectional view showing main parts of the semiconductor device 103. FIG. 36 is a side view showing the semiconductor device 103.

The semiconductor device 103 includes a substrate 1, a first direction sensor element 2, a second direction sensor element 3, a third direction sensor element 4, an integrated circuit element 5, and a sealing resin 7. Note that the semiconductor device 103 may include only the first direction sensor element 2, and may not include the second direction sensor element 3 or the third direction sensor element 4.

The first direction sensor element 2 is mounted on the main surface 111 of the substrate 1. In this embodiment, the first direction sensor element 2 is bonded to the main surface 111 by a bonding member 23. The bonding member 23 may be either an insulating bonding member or a conductive bonding member. Also, when the substrate 1 is configured to have the recessed portion 114 in the semiconductor device 101A, the first direction sensor element 2 may be mounted on the bottom surface 115 of the recessed portion 114.

The first direction sensor element 2 has a first main portion 201A and a second main portion 202A. The first main port ion 201A is formed of a semiconductor, and includes a magnetic material wire 21. The magnetic material wire 21 extends parallel to the z-direction. The second main portion 202A is formed of an insulating material, and in this embodiment, is formed of a resin. The second main portion 202A has an element pad 22 facing upward along the z-direction. The first main portion 201A and the second main portion 202A are arranged side by side in the x-direction. A first wire 61 is bonded to the element pad 22.

The first main portion 201A of the first direction sensor element 2 has a semiconductor element exposed side surface 217. The semiconductor element exposed side surface 217 is exposed from the sealing resin 7, facing in a direction crossing the z-direction. In this embodiment, the semiconductor element exposed side surface 217 faces in the x-direction. As shown in FIG. 36, the semiconductor element exposed side surface 217 is exposed from the sealing resin 7, and in this embodiment, has a rectangular surface, as the semiconductor device 103 is viewed laterally.

A height h1 that is a dimension in the z-direction of the first main portion 201A is greater than a thickness t1 that is a dimension in the x-direction of the first main portion 201A. Also, a height h2 that is a dimension in the z-direction of the second main portion 202A is greater than a thickness t2 that is a dimension in the x-direction of the second main portion 202A. Moreover, the height h1 that is a dimension in the z-direction of the first direction sensor element 2 is greater than the sum of the thicknesses t1 and t2 that is a dimension in the x-direction of the first direction sensor element 2.

The sealing resin 7 has a sealing resin outer surface 71 that is flush with the semiconductor element exposed side surface 217 of the first direction sensor element 2. The sealing resin outer surface 71 faces in the x-direction as with the semiconductor element exposed side surface 217.

The substrate 1 has a substrate outer side surface 113 that is flush with the semiconductor element exposed side surface 217 of the first direction sensor element 2. The substrate outer side surface 113 faces in the x-direction as with the semiconductor element exposed side surface 217.

As shown in FIGS. 34 and 35, the bonding member 23 has a bonding member exposed side surface 231. The bonding member exposed side surface 231 is flush with the semiconductor element exposed side surface 217 of the first direction sensor element 2, the sealing resin outer surface 71 of the sealing resin 7, and the substrate outer side surface 113 of the substrate 1, and in this embodiment, faces in the x-direction. As shown in FIG. 36, the bonding member exposed side surface 231 has an elongated band-shaped portion that is located between the semiconductor element exposed side surface 217 and the substrate outer side surface 113, extending along the y-direction, and two triangular portions that are located on opposite sides of the elongated band-shaped portion.

Next, an example method for making the semiconductor device 103 will now be described with reference to FIGS. 37 to 40.

Figure 37:
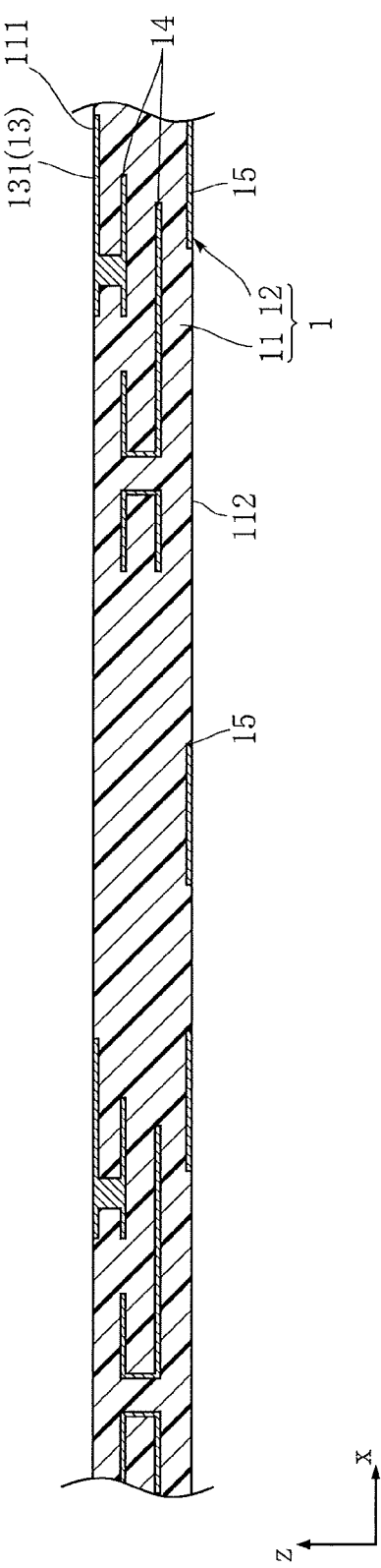
FIG. 37 is a cross-sectional view of main parts showing an example method for making the semiconductor device of FIG. 34.

Initially, as shown in FIG. 37, the substrate 1 is prepared. The substrate 1 shown has a size and configuration that allow for formation of a plurality of the semiconductor devices 103 shown in FIGS. 34 to 36.

Figure 38:
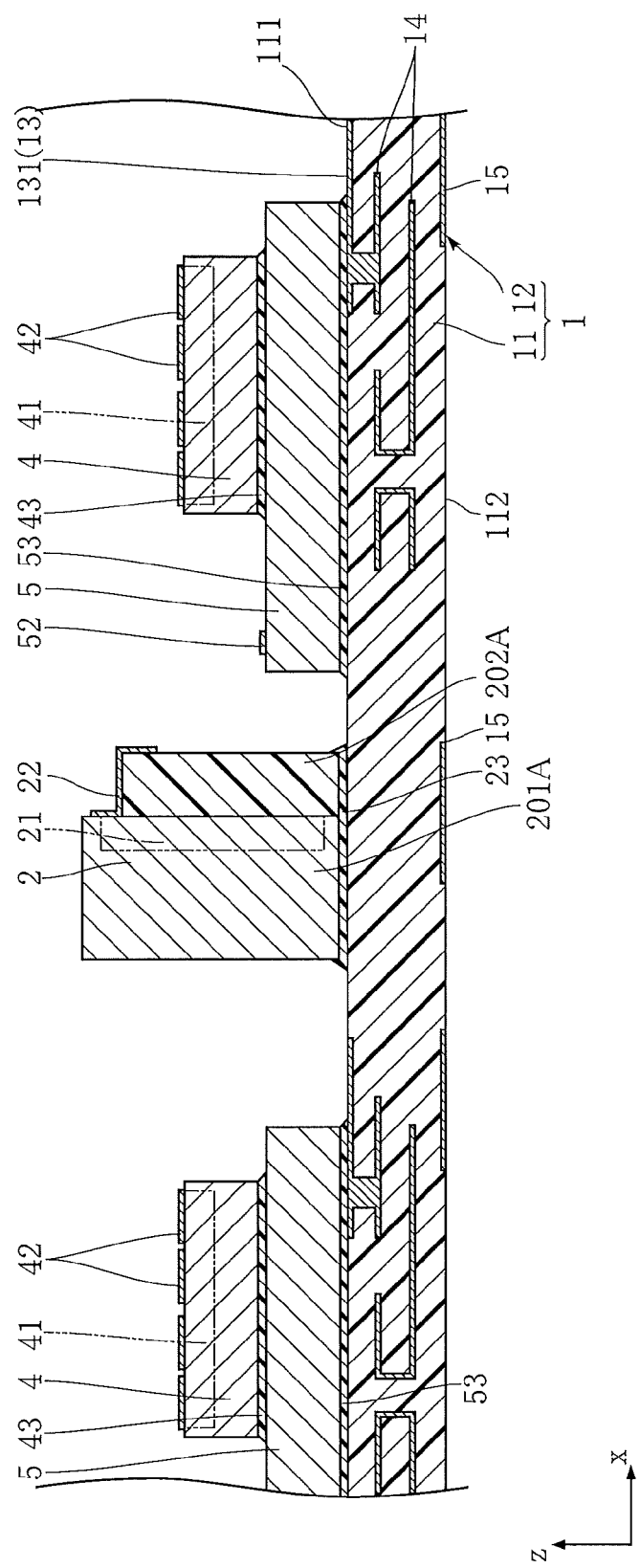
FIG. 38 is a cross-sectional view of main parts showing an example method for making the semiconductor device of FIG. 34.

Next, as shown in FIG. 38, the first direction sensor element 2, the second direction sensor element 3, the third direction sensor element 4, and the integrated circuit element 5 are mounted on the main surface 111 of the substrate 1. To make the plurality of semiconductor devices 103 simultaneously, a plurality of first direction sensor elements 2, second direction sensor elements 3, third direction sensor elements 4, and integrated circuit elements 5 are successively mounted on the substrate 1. The first direction sensor element 2 is mounted using the bonding member 23. In particular, in this embodiment, the bonding member 23 is provided so as to extend off all the perimeter of the first direction sensor element 2 as viewed in the z-direction.

Figure 39:
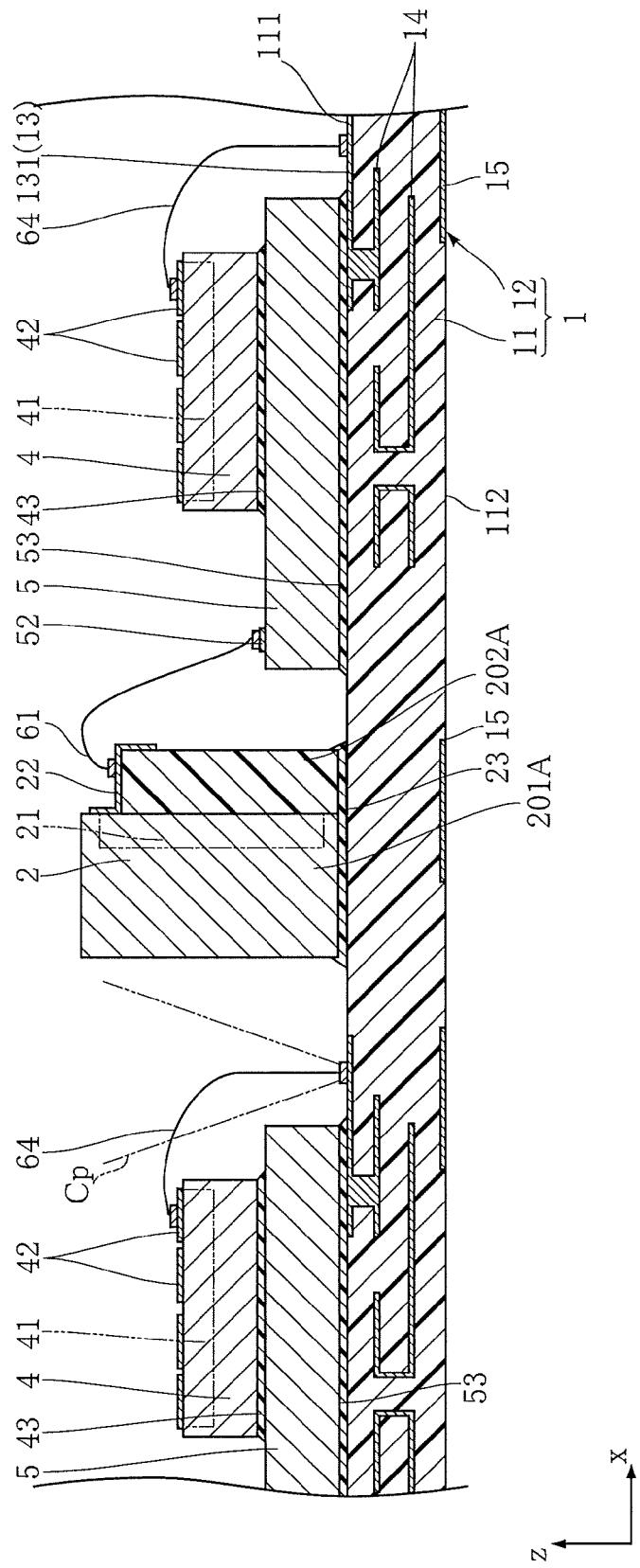
FIG. 39 is a cross-sectional view of main parts showing an example method for making the semiconductor device of FIG. 34.

Next, as shown in FIG. 39, the first wire 61 and the fourth wire 64, and in addition, the second wire 62 and the third wire 63 (not shown), are bonded to respective portions. The bonding is performed using, for example, a capillary Cp shown in FIG. 39.

Figure 40:
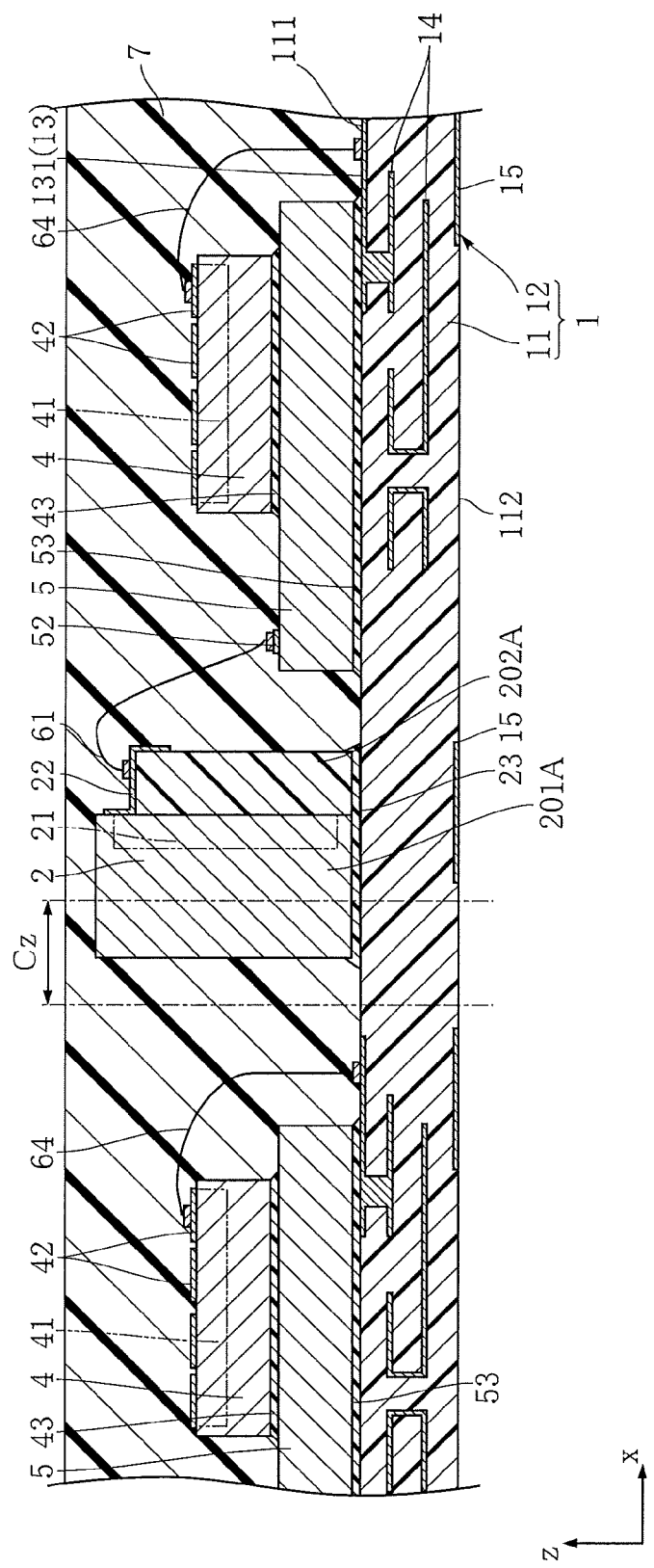
FIG. 40 is a cross-sectional view of main parts showing an example method for making the semiconductor device of FIG. 34.

Next, as shown in FIG. 40, the sealing resin 7 is formed on the main surface 111 of the substrate 1. The sealing resin 7 is formed by, for example, covering the first direction sensor element 2, the second direction sensor element 3, the third direction sensor element 4, the integrated circuit element 5, the first wire 61, the second wire 62, the third wire 63, and the fourth wire 64 with a liquid resin material and thereafter curing the resin material. Thereafter, the substrate 1, the first direction sensor element 2, the bonding member 23, and the sealing resin 7 are simultaneously cut to remove a cut region Cz. Also, in addition to the cutting, additional cutting is performed as appropriate to form an outer shape of the semiconductor device 103. By the above steps, a plurality of semiconductor devices 103 can be made.

Next, advantages of the semiconductor device 103 will be described.

According to this embodiment, a dimension in the x-direction of the first direction sensor element 2 of FIG. 38 is greater than the dimension in the x-direction of the first direction sensor element 2 in the semiconductor device 103 of FIG. 34. Therefore, when the first wire 61 is bonded to the element pad 22, even if a force is applied to the second main portion 202A of the first direction sensor element 2, and a moment occurs that tries to tilt the first direction sensor element 2, the first direction sensor element 2 can be prevented from being tilted. As a result, the first direction sensor element 2 can be electrically connected more reliably and stably.

Also, as shown in FIG. 40, because the cut region Cz is cut, a portion of the first main portion 201A of the first direction sensor element 2 is removed, and therefore, in the semiconductor device 103, the semiconductor element exposed side surface 217 of the first direction sensor element 2 is exposed. Therefore, the semiconductor device 103 can be avoided from having an unduly large size as viewed from above.

In particular, in this embodiment, the thickness t1 is smaller than the height h1, and the thickness t2 is smaller than the height h2. In other words, the first direction sensor element 2 has a relatively small thickness in the x-direction and is mounted in an upright position along the z-direction. The first direction sensor element 2 thus configured is likely to be tilted if an unbalanced downward force along the z-direction is applied to the first direction sensor element 2. In this embodiment, when the first wire 61 is bonded, the first direction sensor element 2 has a relatively large dimension in the x-direction. As a result, the first direction sensor element 2 having a relatively small thickness can be avoided from being tilted. Moreover, in FIGS. 38 and 39, the bonding member 23 is provided so as to extend off all the perimeter of the first direction sensor element 2 as viewed in the z-direction. This preferably prevents the first direction sensor element 2 from being tilted.

The semiconductor device of the present invention and the method for making the semiconductor device are not intended to be limited to the above embodiments. Various changes can be made to the design of the specific configuration of the semiconductor device of the present invention and the method for making the semiconductor device.

The configuration of the present invention and its variations will now be described as appendixes.

[Appendix 1A]

A semiconductor device including:

a semiconductor element having at least one element pad; and a wire having a bonding portion bonded to the element pad, wherein the semiconductor element has a reference surface and a bonding surface, an angle between the reference surface and the bonding surface is less than 180°, and at least a portion of the element pad is formed on the bonding surface, and the bonding portion of the wire is located closer to a separate edge of the bonding surface located on an opposite side from a boundary between the reference surface and the bonding portion than to the boundary.

[Appendix 2A]

The semiconductor device according to appendix 1A, wherein the element pad has a portion formed on the reference surface.

[Appendix 3A]

The semiconductor device according to appendix 1A, wherein the element pad is formed by plating.

[Appendix 4A]

The semiconductor device according to appendix 3A, wherein the element pad has a portion that becomes thinner toward the boundary from the separate edge.

[Appendix 5A]

The semiconductor device according to appendix 4A, wherein the element pad has a main plating layer.

[Appendix 6A]

The semiconductor device according to appendix 5A, wherein the main plating layer is formed of Cu.

[Appendix 7A]

The semiconductor device according to appendix 4A, wherein the main plating layer has a portion that becomes thinner toward the boundary from the separate edge.

[Appendix 8A]

The semiconductor device according to appendix 5A, wherein the element pad has a top plating layer stacked on top of the main plating layer.

[Appendix 9A]

The semiconductor device according to appendix 8A, wherein the top plating layer has an average thickness smaller than an average thickness of the main plating layer.

[Appendix 10A]

The semiconductor device according to appendix 9A, wherein the top plating layer is formed of Au.

[Appendix 11A]

The semiconductor device according to appendix 10A, wherein the wire is formed of Au.

[Appendix 12A]

The semiconductor device according to appendix 9A, wherein the top plating layer has a portion that becomes thinner toward the boundary from the separate edge.

[Appendix 13A]

The semiconductor device according to appendix 12A, wherein the main plating layer has a portion that is closer to the boundary and is exposed from the top plating layer.

[Appendix 14A]

The semiconductor device according to appendix 5A, wherein the element pad has an underlying plating layer interposed between the main plating layer and the bonding surface.

[Appendix 15A]

The semiconductor device according to appendix 14A, wherein the underlying plating layer is formed of Cu.

[Appendix 16A]

The semiconductor device according to appendix 1A, wherein the semiconductor element has a retreat side surface extending from the separate edge in a direction opposite to a direction in which the bonding surface faces.

[Appendix 17A]

The semiconductor device according to appendix 16A, wherein the element pad has a portion formed on the retreat side surface.

[Appendix 18A]

The semiconductor device according to appendix 1A, wherein the semiconductor element has a first main portion and a second main portion that are separate portions and bonded together, the reference surface is formed by the first main portion, and the bonding surface is formed by the second main portion.

[Appendix 19A]

The semiconductor device according to appendix 18A, wherein the first main portion and the second main portion are separate portions and bonded together.

[Appendix 20A]

The semiconductor device according to appendix 19A, wherein the first main portion is formed of a semiconductor.

[Appendix 21A]

The semiconductor device according to appendix 19A, wherein the second main portion is formed of an insulating material.

[Appendix 22A]

The semiconductor device according to appendix 21A, wherein the second main portion is formed of a resin.

[Appendix 23A]

The semiconductor device according to appendix 18A, wherein the first main portion and the second main portion are integrally formed.

[Appendix 24A]

The semiconductor device according to appendix 1A, including a substrate including a base member having a main surface and a back surface facing in opposite directions along a thickness direction, and a semiconductor pattern formed on the base member and including the substrate pad, wherein the semiconductor element is mounted on the main surface.

[Appendix 25A]

The semiconductor device according to appendix 24A, wherein the substrate has a substrate pad, and the wire is bonded to the substrate pad.

[Appendix 26A]

The semiconductor device according to appendix 20A, including an integrated circuit element mounted on the substrate.

[Appendix 27A]

The semiconductor device according to appendix 26A, wherein the integrated circuit element has an additional element pad, and the wire is bonded to the additional element pad.

[Appendix 28A]

The semiconductor device according to appendix 1A, wherein the substrate has a recessed portion that is recessed from the main surface toward the back surface, and a portion of the semiconductor element is accommodated in the recessed portion.

[Appendix 29A]

The semiconductor device according to appendix 28A, wherein the recessed portion has a bottom surface located between the main surface and the back surface in the thickness direction, and the semiconductor element is bonded to the bottom surface.

[Appendix 30A]

The semiconductor device according to appendix 29A, wherein the recessed portion has an inner side surface connected to the main surface.

[Appendix 31A]

The semiconductor device according to appendix 30A, wherein the inner side surface is sloped with respect to the thickness direction.

[Appendix 32A]

The semiconductor device according to appendix 31A, wherein the recessed portion has a curved surface connecting the bottom surface and the inner side surface.

[Appendix 33A]

The semiconductor device according to appendix 29A, wherein the interconnect pattern has a middle layer located between the main surface and the back surface in the thickness direction, and the middle layer has a blocking portion forming the bottom surface of the recessed portion.

[Appendix 34A]

The semiconductor device according to appendix 33A, wherein the blocking portion is larger than the bottom surface as viewed in the thickness direction.

[Appendix 35A]

The semiconductor device according to appendix 33A, wherein the base member has a portion located closer to the back surface relative to the middle layer.

[Appendix 36A]

The semiconductor device according to appendix 35A, wherein the interconnect pattern has a plurality of back surface electrodes exposed toward the back surface.

[Appendix 37A]

The semiconductor device according to appendix 36A, wherein any of the plurality of back surface electrodes coincides with the blocking portion of the middle layer as viewed in the thickness direction.

[Appendix 38A]

The semiconductor device according to appendix 37A, wherein the blocking portion and the plurality of back surface electrodes are insulated from each other.

[Appendix 39A]

The semiconductor device according to appendix 18A, wherein the semiconductor element is a direction sensor element including a detection reference axis in the first main portion.

[Appendix 1B]

A semiconductor device including:

a substrate; and a direction sensor element having a detection reference axis, wherein the substrate has at least one substrate pad facing in one direction along a thickness direction, the direction sensor element has a semiconductor portion including the detection reference axis, and an auxiliary portion bonded to the semiconductor portion, the auxiliary portion has a pad surface facing the substrate pad, the semiconductor portion has a reference surface extending from an edge of the pad surface toward the substrate, the direction sensor element has an element pad having at least a portion formed on the pad surface, and the element pad and the substrate pad are bonded together by a conductive bonding member.

[Appendix 2B]

The semiconductor device according to appendix 1B, wherein the element pad is formed, extending from the pad surface to the reference surface.

[Appendix 3B]

The semiconductor device according to appendix 2B, wherein the conductive bonding member is bonded to a portion of the element pad that is formed on the reference surface.

[Appendix 4B]

The semiconductor device according to appendix 1B, wherein the pad surface has a separate edge located on an opposite side from the reference surface, the auxiliary portion has a retreat side surface extending from the separate edge in a direction away from the substrate, and the element pad has a portion formed on the retreat side surface.

[Appendix 5B]

The semiconductor device according to appendix 4B, wherein the conductive bonding member is bonded to a portion of the clement pad that is formed on the retreat side surface.

[Appendix 6B]

The semiconductor device according to appendix 1B, wherein the semiconductor portion has a bonding surface bonded to the substrate.

[Appendix 7B]

The semiconductor device according to appendix 6B, wherein the bonding surface is perpendicular to the reference surface.

[Appendix 8B]

The semiconductor device according to appendix 7B, wherein the bonding surface is perpendicular to the detection reference axis.

[Appendix 9B]

The semiconductor device according to appendix 1B, wherein the substrate includes a base member having a main surface and a back surface facing in opposite directions along a thickness direction, and a semiconductor pattern formed on the base member and including the substrate pad, and the substrate pad is formed on the main surface.

[Appendix 10B]

The semiconductor device according to appendix 9B, further including an integrated circuit element mounted on the substrate, wherein the interconnect pattern is electrically connected to the substrate pad, and has an additional substrate pad electrically connected to the integrated circuit element.

[Appendix 11B]

The semiconductor device according to appendix 10B, wherein the integrated circuit element and the additional substrate pad are electrically connected together through a wire.

[Appendix 12B]

The semiconductor device according to appendix 10B, wherein the integrated circuit element and the additional substrate pad are electrically connected together through a conductive bonding member.

[Appendix 13B]

The semiconductor device according to appendix 10B, wherein the auxiliary portion is located on the same side of the semiconductor portion where the integrated circuit element is provided.

[Appendix 14B]
The semiconductor device according to appendix 10B, wherein the auxiliary portion is located on an opposite side of the semiconductor portion from the integrated circuit element.

[Appendix 15B]
The semiconductor device according to appendix 9B, wherein the substrate has a recessed portion that is recessed from the main surface toward the back surface, and
a portion of the semiconductor portion is accommodated in the recessed portion.

[Appendix 16B]
The semiconductor device according to appendix 15B, wherein the recessed port ion has a bottom surface located between the main surface and the back surface in the thickness direction, and
the semiconductor portion is bonded to the bottom surface.

[Appendix 17B]
The semiconductor device according to appendix 16B, wherein the recessed portion has an inner side surface connected to the main surface.

[Appendix 18B]
The semiconductor device according to appendix 17B, wherein the inner side surface is sloped with respect to the thickness direction.

[Appendix 19B]
The semiconductor device according to appendix 18B, wherein the recessed portion has a curved surface connecting the bottom surface and the inner side surface together.

[Appendix 20B]
The semiconductor device according to appendix 16B, wherein the interconnect pattern has a middle layer located between the main surface and the back surface in the thickness direction, and the middle layer has a blocking portion forming the bottom surface of the recessed portion.

[Appendix 21B]
The semiconductor device according to appendix 20B, wherein the blocking portion is larger than the bottom surface as viewed in the thickness direction.

[Appendix 22B]
The semiconductor device according to appendix 21B, wherein the base member has a portion located closer to the back surface relative to the middle layer.

[Appendix 23B]
The semiconductor device according to appendix 22B, wherein the interconnect pattern has a plurality of back surface electrodes exposed toward the back surface.

[Appendix 24B]
The semiconductor device according to appendix 23B, wherein any of the plurality of back surface electrodes coincides with the blocking portion of the middle layer as viewed in the thickness direction.

[Appendix 25B]
The semiconductor device according to appendix 24B, wherein the blocking portion and the plurality of back surface electrodes are insulated from each other.

[Appendix 26B]
The semiconductor device according to appendix 10B, including
at least one additional direction sensor element having a detection reference axla for a direction different from that of the detection reference axis of the direction sensor element.

[Appendix 27B]
The semiconductor device according to appendix 26B, wherein the additional direction sensor element is mounted in the integrated circuit element.

[Appendix 28B]
The semiconductor device according to appendix 1B, wherein the conductive bonding member is solder.

The invention claimed is:

1. A semiconductor device comprising:
a substrate including a base member having a main surface and a back surface facing opposite in a thickness direction;
a first, a second and a third sensor elements each having at least one element pad and mounted on the main surface of the substrate;
a control element that processes outputs from the first, the second and the third sensor elements; and
a sealing resin formed on the main surface of the substrate, and covering the control element and at least a portion of each of the sensor elements,
wherein the first sensor element includes an element side surface that faces in a direction crossing the thickness direction of the substrate,
the second sensor element and the third sensor element are mounted on the control element so as to be spaced apart from the substrate,
the first sensor element has a first main portion and a second main portion,
the second main portion has a bonding surface on which the element pad of the first sensor element is formed, and
the element pad of the first sensor element becomes thinner as proceeding toward the first main portion.

2. The semiconductor device according to claim 1, wherein the base member includes a substrate outer side surface that connects the main surface and the back surface to each other and is flush with the element side surface.

3. The semiconductor device according to claim 2, wherein the sealing resin has a sealing resin outer surface flush with both the element side surface and the substrate outer side surface of the base member.

4. The semiconductor device according to claim 1, wherein the element side surface is perpendicular to the thickness direction of the substrate.

5. The semiconductor device according to claim 1, wherein the element side surface is formed on the first main portion.

6. The semiconductor device according to claim 5, wherein the first main portion is formed of a semiconductor.

7. The semiconductor device according to claim 1, wherein the second main portion is formed of an insulating material.

8. The semiconductor device according to claim 7, wherein the second main portion is formed of a resin.

9. The semiconductor device according to claim 1, wherein the first main portion and the second main portion are arranged side by side in a direction in which the element side surface faces.

10. The semiconductor device according to claim 9, wherein a dimension of the first main portion in the thickness direction of the substrate is greater than a dimension of the first main portion in a direction in which the element side surface faces.

11. The semiconductor device according to claim 9, wherein a dimension of the second main portion in the thickness direction of the substrate is greater than a dimension of the second main portion in a direction in which the element side surface faces.

12. The semiconductor device according to claim 10, wherein a dimension of the first sensor element in the thickness direction of the substrate is greater than a dimension of the semiconductor element in a direction in which the element side surface faces.

13. The semiconductor device according to claim 1, wherein the first sensor element is bonded to the substrate by a bonding member.

14. The semiconductor device according to claim 13, wherein the bonding member is an insulating bonding member.

15. The semiconductor device according to claim 13, wherein the bonding member is a conductive bonding member.

16. The semiconductor device according to claim 13, wherein the bonding member has a bonding member exposed side surface flush with the element side surface.

17. The semiconductor device according to claim 1, wherein the first sensor element is a direction sensor element including a detection reference axis in the first main portion.

18. The semiconductor device according to claim 17, wherein the detection reference axis is parallel to the thickness direction of the substrate.

19. The semiconductor device according to claim 1, wherein the element side surface is exposed from the sealing resin.

\* \* \* \* \*